(12) United States Patent
Lee et al.

(10) Patent No.: US 11,881,268 B2
(45) Date of Patent: Jan. 23, 2024

(54) SEMICONDUCTOR MEMORY DEVICE AND STORAGE SYSTEM INCLUDING SEMICONDUCTOR MEMORY DEVICE

(71) Applicant: Samsung Electronics Co., Ltd., Suwon-si (KR)

(72) Inventors: Hye Ji Lee, Hwaseong-si (KR); Jin-Kyu Kang, Hwaseong-si (KR); Rae Young Lee, Hwaseong-si (KR); Se Jun Park, Yongin-si (KR); Jae Duk Lee, Seongnam-si (KR); Gu Yeon Han, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 102 days.

(21) Appl. No.: 17/712,238

(22) Filed: Apr. 4, 2022

(65) Prior Publication Data

US 2023/0022639 A1    Jan. 26, 2023

(30) Foreign Application Priority Data

Jul. 26, 2021   (KR) .................. 10-2021-0097506

(51) Int. Cl.
| | | |
|---|---|---|
| *G11C 16/16* | (2006.01) | |
| *G11C 16/04* | (2006.01) | |
| *G11C 11/56* | (2006.01) | |
| *H10B 41/27* | (2023.01) | |
| *H10B 43/27* | (2023.01) | |

(52) U.S. Cl.
CPC .......... *G11C 16/16* (2013.01); *G11C 11/5635* (2013.01); *G11C 11/5671* (2013.01); *G11C 16/0483* (2013.01); *H10B 41/27* (2023.02); *H10B 43/27* (2023.02)

(58) Field of Classification Search
CPC . G11C 16/16; G11C 11/5635; G11C 11/5671; G11C 16/0483; G11C 16/08; G11C 16/32; G11C 16/14; G11C 8/14; H10B 41/27; H10B 43/27; H10B 53/20
See application file for complete search history.

(56) References Cited

U.S. PATENT DOCUMENTS

| | | |
|---|---|---|
| 8,351,277 B2 | 1/2013 | Mikajiri et al. |
| 8,767,466 B2 | 7/2014 | Asaoka et al. |
| 9,711,228 B1 | 7/2017 | Tanzawa |
| 9,734,913 B2 | 8/2017 | Lee et al. |
| 9,824,765 B2 | 11/2017 | Park et al. |

(Continued)

*Primary Examiner* — Jay W. Radke
(74) *Attorney, Agent, or Firm* — Harness, Dickey & Pierce, P.L.C.

(57) ABSTRACT

A semiconductor memory device includes a source layer, a channel structure, gate electrodes on the source layer and spaced apart on a sidewall of the channel structure, and a common source line. The gate electrodes include a first word line group including first and second gate electrodes and a second word line group including third and fourth gate electrodes. The semiconductor memory device, in response to a voltage of the common source line reaching a target voltage, causes an inhibition voltage to be applied to the second word line group and an erase voltage to be applied to the first word line group in a first erase operation interval, and causes the inhibition voltage to be applied to the first word line group and the erase voltage to be applied to the second word line group in a second erase operation interval.

20 Claims, 17 Drawing Sheets

(56) References Cited

U.S. PATENT DOCUMENTS

| | | |
|---|---|---|
| 10,964,398 B2 | 3/2021 | Nam et al. |
| 2019/0221267 A1* | 7/2019 | Ko .................... G11C 16/0483 |
| 2021/0043260 A1 | 2/2021 | Tsuda |
| 2021/0065809 A1* | 3/2021 | Hwang .................. G11C 5/063 |

* cited by examiner

SEMICONDUCTOR MEMORY DEVICE AND STORAGE SYSTEM INCLUDING SEMICONDUCTOR MEMORY DEVICE

CROSS-REFERENCE TO RELATED APPLICATION

This application claims priority from Korean Patent Application No. 10-2021-0097506, filed on Jul. 26, 2021 in the Korean Intellectual Property Office, the disclosure of which is incorporated herein by reference in its entirety.

BACKGROUND

1. Technical Field

The present inventive concepts relate to semiconductor memory devices and storage systems including the semiconductor memory devices.

2. Description of the Related Art

As the demand for high-capacity memory devices with small size increases, research on memory devices having vertically stacked memory cells is being actively conducted. A charge trap flash memory cell among the memory cells continuously maintains or removes charge stored by tunneling or hot electron injection into a charge trap layer in the memory cell to perform programming and deleting of information.

When the charge stored in the programmed memory cell is lost over time, it is determined that as a threshold voltage of the programmed cell decreases, the information has been erased, which may cause a read error. Therefore, the flash memory cell requires excellent data retention characteristics for maintaining stored information regardless of the lapse of time without applying a bias in order to secure reliability.

SUMMARY

Some example embodiments of the present inventive concepts provide a semiconductor device having improved reliability of a memory cell through an erase operation (which the semiconductor device may be configured to perform) that uses a couple-up operation for a channel potential. In some memory devices, since the retention characteristics of a flash memory cell may be affected by an erase operation of adjacent memory cells, the semiconductor device may be configured to perform an erase operation that reflects a structure and operating voltage characteristics of adjacent memory cells and which improves reliability of the memory cells (e.g., based on reducing erase distribution width of the memory cells and/or improving data retention of adjacent memory cells).

Some example embodiments of the present inventive concepts provide a semiconductor device having improved reliability of a memory cell through an erase operation (which the semiconductor device may be configured to perform) that reflects structural characteristics of a channel structure.

Example embodiments of the present inventive concepts are not limited to the example embodiments mentioned above, and other example embodiments not mentioned above will be clearly understood by those skilled in the art from the following description.

According to some example embodiments, a semiconductor memory device may include a source layer in a substrate and including a conductive material doped with first conductivity type impurities, a channel structure on the substrate, including a vertical insulation layer and a vertical channel layer, and extending in a first direction that is perpendicular to an upper surface of the substrate, a plurality of gate electrodes on the source layer and spaced apart from each other in the first direction on a sidewall of the channel structure, wherein the plurality of gate electrodes include a first word line group including a first gate electrode and a second gate electrode that are continuously arranged in the first direction and a second word line group including a third gate electrode and a fourth gate electrode that are continuously arranged in the first direction, and a common source line electrically connected to the source layer. The semiconductor memory device may be configured to, in response to a voltage of the common source line reaching a target voltage, cause an inhibition voltage to be applied to the second word line group and an erase voltage to be applied to the first word line group in a first interval during an erase operation, and cause the inhibition voltage to be applied to the first word line group and the erase voltage to be applied to the second word line group in a second interval after the first interval during the erase operation.

According to some example embodiments, a semiconductor memory device may include a source layer in a substrate and including a conductive material doped with first conductivity type impurities, a channel structure on the substrate, including a vertical insulation layer and a vertical channel layer, and extending in a first direction that is perpendicular to an upper surface of the substrate, a plurality of gate electrodes on the source layer and spaced apart from each other in the first direction on a sidewall of the channel structure, wherein the plurality of gate electrodes include first to third word line groups sequentially arranged in the first direction from the substrate, and a common source line electrically connected to the source layer, wherein the semiconductor memory device is configured to, in response to a voltage of the common source line reaching a target voltage, cause an inhibition voltage to be applied to the second word line group and an erase voltage to be applied to the first word line group in a first interval during an erase operation, cause the inhibition voltage to be applied to the first word line group and the erase voltage to be applied to the second word line group in a second interval after the first interval during the erase operation, and cause the erase voltage to be applied to the third word line group in the first and second intervals during the erase operation.

According to some example embodiments, a storage system includes a non-volatile memory device, and a controller electrically connected to the non-volatile memory device, wherein the non-volatile memory device includes, a source layer in a substrate and including a conductive material doped with first conductivity type impurities, a channel structure on the substrate, including a vertical insulation layer and a vertical channel layer, and extending in a first direction that is perpendicular to an upper surface of the substrate, a plurality of gate electrodes on the source layer and spaced apart from each other in the first direction on a sidewall of the channel structure, wherein the plurality of gate electrodes includes a first word line group including a first gate electrode and a second gate electrode that are continuously arranged in the first direction and a second word line group including a third gate electrode and a fourth gate electrode that are continuously arranged in the first direction, a plurality of pass transistors connected to the plurality of gate electrodes, and a common source line electrically connected to the source layer, wherein the storage system is configured to, in response to a voltage of the common source line reaching a target voltage, causing an inhibition voltage to be applied to the second word line group and an erase voltage to be applied to the first word line group in a first interval during an erase operation, and cause the inhibition voltage to be applied to the first word line group and the erase voltage to be applied to the second word line group in a second interval after the first interval during the erase operation.

A semiconductor memory device according to some example embodiments includes a memory cell region including a first metal pad on a first substrate, and a peripheral circuit region including a second metal pad on a second substrate, wherein the peripheral circuit region is connected to the memory cell region by the first and second metal pads connected in a first direction that is perpendicular to the first and second substrates, wherein the memory cell region includes, a source layer in the first substrate and including a conductive material doped with first conductivity type impurities, a channel structure on the first substrate, including a vertical insulation layer and a vertical channel layer, and extending in the first direction, a plurality of gate electrodes on the source layer and spaced apart from each other in the first direction on a sidewall of the channel structure, wherein the plurality of gate electrodes includes a first word line group including a first gate electrode and a second gate electrode that are continuously arranged in the first direction and a second word line group including a third gate electrode and a fourth gate electrode that are continuously arranged in the first direction, and a common source line electrically connected to the source layer, wherein the semiconductor memory device is configured to, in response to a voltage of the common source line reaching a target voltage, cause an inhibition voltage to be applied to the second word line group and an erase voltage to be applied to the first word line group in a first interval during an erase operation, and cause the inhibition voltage to be applied to the first word line group and the erase voltage to be applied to the second word line group in a second interval after the first interval during the erase operation.

BRIEF DESCRIPTION OF THE DRAWINGS

The above and other aspects and features of the present inventive concepts will become more apparent by describing in detail example embodiments thereof with reference to the attached drawings, in which.

DETAILED DESCRIPTION

Figure 1:
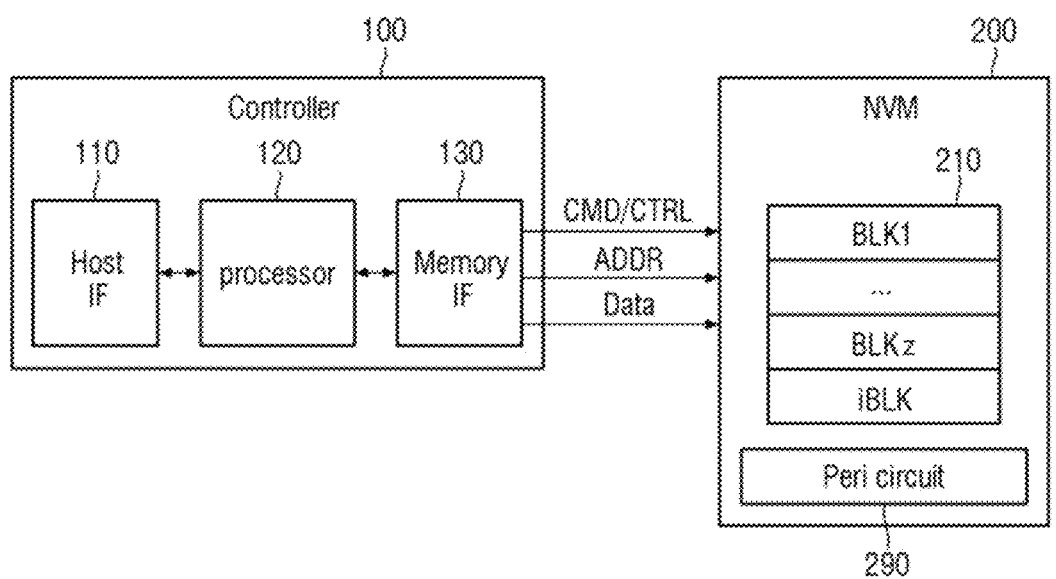
FIG. 1 is a block diagram showing a storage device according to some example embodiments of the present inventive concepts.

Hereinafter, some example embodiments according to the spirit and scope of the present inventive concepts will be described with reference to the accompanying drawings. In the description of FIGS. 1 to 17, the same reference numerals are used for substantially the same components, and duplicate descriptions of the corresponding components will be omitted. Also, similar reference numerals are used for similar components throughout various drawings of the present inventive concepts.

It will be understood that when an element such as a layer, film, region, or substrate is referred to as being "on" another element, it may be directly on the other element or intervening elements may also be present. In contrast, when an element is referred to as being "directly on" another element, there are no intervening elements present. It will further be understood that when an element is referred to as being "on" another element, it may be above or beneath or adjacent (e.g., horizontally adjacent) to the other element.

It will be understood that elements and/or properties thereof (e.g., structures, surfaces, directions, or the like), which may be referred to as being "perpendicular," "parallel," "coplanar," or the like with regard to other elements and/or properties thereof (e.g., structures, surfaces, directions, or the like) may be "perpendicular," "parallel," "coplanar," or the like or may be "substantially perpendicular," "substantially parallel," "substantially coplanar," respectively, with regard to the other elements and/or properties thereof.

Elements and/or properties thereof (e.g., structures, surfaces, directions, or the like) that are "substantially perpendicular" with regard to other elements and/or properties thereof will be understood to be "perpendicular" with regard to the other elements and/or properties thereof within manufacturing tolerances and/or material tolerances and/or have a deviation in magnitude and/or angle from "perpendicular," or the like with regard to the other elements and/or properties thereof that is equal to or less than 10% (e.g., a. tolerance of ±10%).

Elements and/or properties thereof (e.g., structures, surfaces, directions, or the like) that are "substantially parallel" with regard to other elements and/or properties thereof will be understood to be "parallel" with regard to the other elements and/or properties thereof within manufacturing tolerances and/or material tolerances and/or have a deviation in magnitude and/or angle from "parallel," or the like with regard to the other elements and/or properties thereof that is equal to or less than 10% (e.g., a. tolerance of ±10%).

Elements and/or properties thereof (e.g., structures, surfaces, directions, or the like) that are "substantially coplanar" with regard to other elements and/or properties thereof will be understood to be "coplanar" with regard to the other elements and/or properties thereof within manufacturing tolerances and/or material tolerances and/or have a deviation in magnitude and/or angle from "coplanar," or the like with regard to the other elements and/or properties thereof that is equal to or less than 10% (e.g., a. tolerance of ±10%)).

It will be understood that elements and/or properties thereof may be recited herein as being "the same" or "equal" as other elements, and it will be further understood that elements and/or properties thereof recited herein as being "identical" to, "the same" as, or "equal" to other elements may be "identical" to, "the same" as, or "equal" to or "substantially identical" to, "substantially the same" as or "substantially equal" to the other elements and/or properties thereof. Elements and/or properties thereof that are "substantially identical" to, "substantially the same" as or "substantially equal" to other elements and/or properties thereof will be understood to include elements and/or properties thereof that are identical to, the same as, or equal to the other elements and/or properties thereof within manufacturing tolerances and/or material tolerances. Elements and/or properties thereof that are identical or substantially identical to and/or the same or substantially the same as other elements and/or properties thereof may be structurally the same or substantially the same, functionally the same or substantially the same, and/or compositionally the same or substantially the same.

It will be understood that elements and/or properties thereof described herein as being "substantially" the same and/or identical encompasses elements and/or properties thereof that have a relative difference in magnitude that is equal to or less than 10%. Further, regardless of whether elements and/or properties thereof are modified as "substantially," it will be understood that these elements and/or properties thereof should be construed as including a manufacturing or operational tolerance (e.g., ±10%) around the stated elements and/or properties thereof.

When the terms "about" or "substantially" are used in this specification in connection with a numerical value, it is intended that the associated numerical value include a tolerance of ±10% around the stated numerical value. When ranges are specified, the range includes all values therebetween such as increments of 0.1%.

Figure 2:
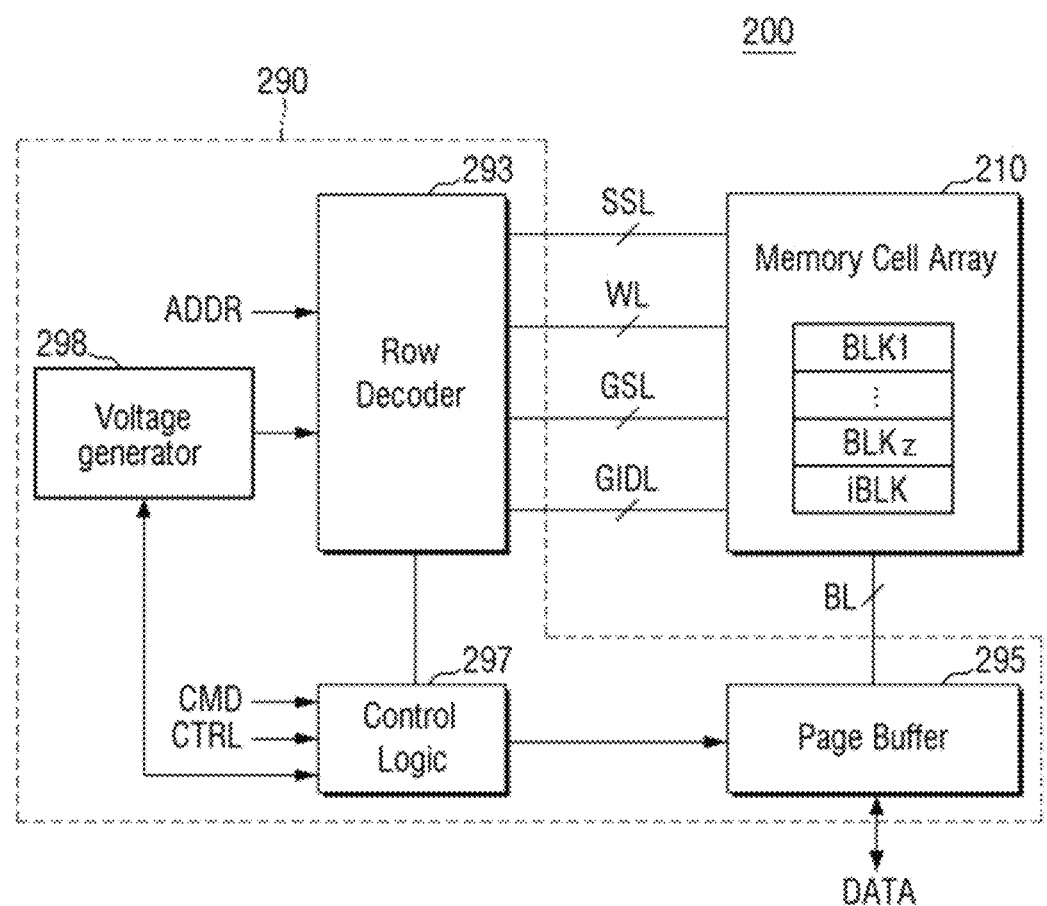
FIG. 2 is a block diagram showing a semiconductor memory device according to some example embodiments of the present inventive concepts.

FIG. 1 is a block diagram showing a storage device 10 according to some example embodiments of the present inventive concepts. FIG. 2 is a block diagram showing a semiconductor memory device 200 according to some example embodiments of the present inventive concepts.

Referring to FIGS. 1 and 2, the storage device 10 includes a controller 100 and a semiconductor memory device 200.

The controller 100 may access the semiconductor memory device 200 which is a non-volatile memory device (NVM). The controller 100 may access the semiconductor memory device 200 through a voltage generator 298 and a control logic 297. The controller 100 may control the overall operation of the storage device 10 according to some example embodiments.

For example, the controller 100 may perform a program operation, a read operation, or an erase operation according to a request of an external device (e.g., a host). The controller 100 may write program-requested data to the semiconductor memory device 200 and read/write read-requested data from/to the semiconductor memory device 200.

The controller 100 may include a processor 120 (e.g., CPU), a host interface 110, and a memory interface 130. Hereinafter, for the sake of simplicity of illustration, the illustration of other configurations of the controller 100 is omitted. For example, although not shown in the drawing, the controller 100 may include a bus or buffer interface.

The processor 120 may control overall operations of the controller 100 and perform logical operations. The processor 120 may communicate with a host (not shown), which is an external device, through the host interface 110 and communicate with the voltage generator 298 through the memory interface 130. In addition, the processor 120 may communicate with the semiconductor memory device 200 through the memory interface 130 and the voltage generator 298. The processor 120 may receive a read command and/or an erase command from the host (not shown), which is an external device, through the host interface 110 and transmit the read command (Read_cmd) and/or the erase command (Erase_cmd) to the control logic 297.

The host interface 110 may be configured to communicate with the host (not shown), which is an external device according to the control of the processor 120. The host interface 110 may be configured to communicate using at least one of various communication methods such as a universal serial bus (USB), a serial AT attachment (SATA), a serial attached SCSI (SAS), a high speed interchip (HSIC), a small computer system interface (SCSI), a peripheral component interconnection (PCI), a PCI express (PCIe), an non-volatile memory express (NVMe), a universal flash storage (UFS), a secure digital (SD), a multimedia card (MMC), an embedded MMC (eMMC), a dual in-line memory module (DIMM), a registered DIMM (RDIMM), a load reduced DIMM (LRDIMM), etc.

The host (not shown) may request a write operation, a read operation, and an erase operation for the storage device 10 through a device driver. In addition, the host (not shown) may execute a video application, a game application, a web browser application, and the like to provide various services. The host (not shown) may be, for example, any electronic device such as a personal computer (PC), a laptop, a mobile phone, a smart phone, a tablet PC, an MP3 player, a personal digital assistant (PDA), an enterprise digital assistant (EDA), a portable multimedia player (PMP), a digital camera, a music player, a portable game console, a navigation device, a wearable device, an internet of things (IoT) device, an internet of everything (IoE) device, an e-book, a virtual reality (VR) device, an augmented reality (AR) device, or the like.

The memory interface 130 may communicate a command CMD, an address ADDR, and data DATA with the semiconductor memory device 200 through input/output channels. The memory interface 130 may communicate a control signal CTRL with the semiconductor memory device 200 through a control channel. The control signal CTRL may include a command latch enable CLE, an address latch enable ALE, a chip enable nCE, a write enable nWE, a read enable nRE, and the like. Although not shown in the drawing, the memory interface 130 may include an error correction block.

The semiconductor memory device 200 may include a memory cell array 210 and a peripheral circuit 290.

The memory cell array 210 may include first to zth memory cell blocks BLK1 to BLKz and an information memory cell block iBLK. The first to zth memory cell blocks BLK1 to BLKz may include a plurality of memory cells including a semiconductor element. Each memory cell may store one bit of data or two or more bits of data. A memory cell capable of storing one bit of data in one memory cell is called a single level cell (SLC) or a single bit cell. A memory cell capable of storing two bits of data in one memory cell is called a multi-level cell (MLC) or a multi-bit cell. A memory cell capable of storing three bits of data in one memory cell is called a triple level cell (TLC) or a triple bit cell. In addition, there is a quad level cell or the like.

The first to zth memory cell blocks BLK1 to BLKz may be connected to the peripheral circuit 290 through bit lines BL, word lines WL, at least one string selection line SSL, at least one ground selection line GSL, and at least one gate-induced drain leakage (GIDL) line.

Specifically, the first to zth memory cell blocks BLK1 to BLKz may be connected to a row decoder 293 through the word lines WL, at least one string selection line SSL, at least one ground selection line GSL, and at least one gate-induced drain leakage (GIDL) line. Also, the first to zth memory cell blocks BLK1 to BLKz may be connected to a page buffer 295 through the bit lines BL.

The information memory cell block iBLK stores the first to zth memory cell blocks BLK1 to BLKz. The control logic 297 also controls the first to zth memory cell blocks BLK1 to BLKz with reference to data stored in the information memory cell block iBLK. The information memory cell block iBLK stores information on threshold voltage Vth data, program voltage, erase voltage, and voltage application time of memory cells in each block/word line.

The peripheral circuit 290 may receive an address ADDR, a command CMD, and a control signal CTRL from the outside of the semiconductor memory device 200 and transmit/receive data DATA to/from an external device of the semiconductor memory device 200. The peripheral circuit 290 may include the control logic 297, the row decoder 293, the page buffer 295, and the voltage generator 298 for generating various voltages required for operation.

Although not shown in the drawing, the peripheral circuit 290 may further include various sub circuits such as an input/output circuit, an error correction circuit for correcting an error in the data DATA read-out from the memory cell array 210 of the semiconductor memory device 200, and the like.

The control logic 297 may be connected to the row decoder 293, the voltage generator 298, and the input/output circuit. The control logic 297 may control the overall operation of the semiconductor memory device 200. The control logic 297 may generate various internal control signals used in the semiconductor memory device 200 in response to the control signal CTRL and serve as a controller of the memory cell array 210.

For example, the control logic 297 may adjust a voltage level provided to the word lines WL, at least one string selection line SSL, and at least one ground selection line GSL at least one gate-induced drain leakage (GIDL) line, and the bit lines BL when performing a memory operation such as a program operation, an erase operation, or the like.

The row decoder 293 may include a plurality of pass transistors 293_1, 293_2, 293_5, 293_6, and 293_7 (see FIGS. 7A and 7B) and select at least one of the first to zth memory cell blocks BLK1 to BLKz in response to the address ADDR, and the plurality of pass transistors 293_1, 293_2, 293_5, 293_6, and 293_7 may select at least one word line WL, at least one string selection line SSL, at least one ground selection line GSL, and at least one gate-induced drain leakage (GIDL) line of the selected first to zth memory cell blocks BLK1 to BLKz.

The row decoder 293 according to some example embodiments may deliver operation and erase voltages for performing a memory operation to the word line WL of the first to zth memory cell blocks BLK1 to BLKz selected through the plurality of pass transistors 293_1, 293_2, 293_5, 293_6, and 293_7.

The voltage generator 298 may be controlled by the control logic 297 and may generate the operating voltage and erase voltage for performing the memory operation delivered by the row decoder 293 to the memory cell array 210. In particular, the voltage generator 298 may generate a voltage of a block signal applied to gates of the plurality of pass transistors 293_1, 293_2, 293_5, 293_6, and 293_7 of the row decoder 293 during the erase operation, and the row decoder 293 may select at least one of the plurality of memory cell blocks BLK1 to BLKz through the generated block voltage. In some example embodiments, a pass signal may be provided to each of the gates of the plurality of pass transistors to control at least one word line WL, at least one string selection line SSL, at least one ground selection line GSL and at least one gate-induced drain leakage GIDL line in the memory cell block.

In addition, the voltage generator 298 may generate a high voltage (e.g., 20V) applied to a substrate (e.g., common source line) during an erase operation for at least one block of ath to nth memory cell blocks BLKa to BLKn.

The page buffer 295 may be connected to the memory cell array 210 through the bit lines BL. The page buffer 295 may operate as a writer driver or a sense amplifier. Specifically, during a program operation, the page buffer 295 may operate as the writer driver to apply a voltage according to the data DATA to be stored in the memory cell array 210 to the bit lines BL. Meanwhile, during a read-out operation or a verification operation, the page buffer 295 may operate as the sense amplifier to detect the data DATA stored in the memory cell array 210 and detect whether data in the memory cell block has been erased.

Figure 3:
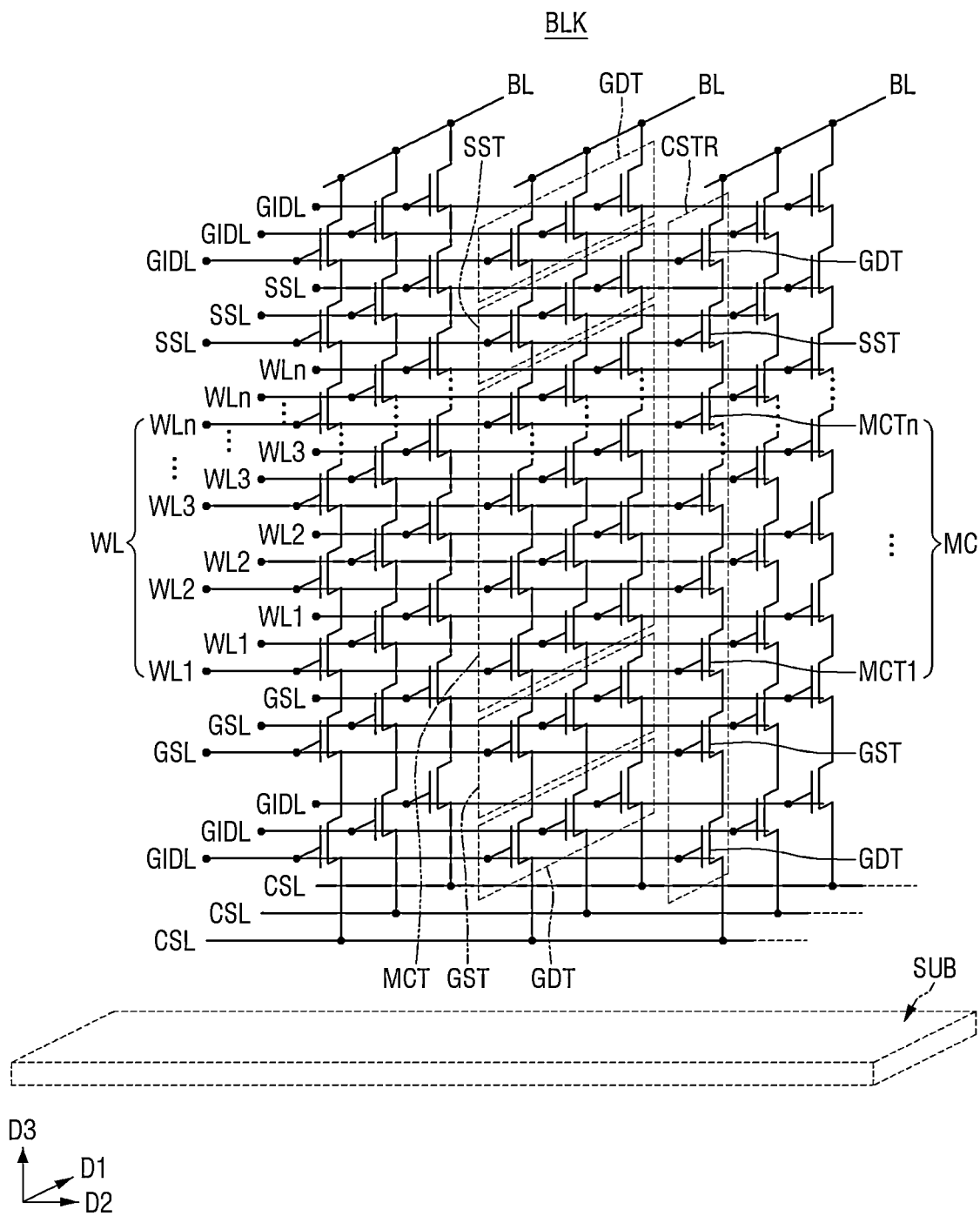
FIG. 3 is a circuit diagram showing one memory cell block among a plurality of memory cell blocks in a memory cell array according to some example embodiments of the present inventive concepts.
Figure 4:
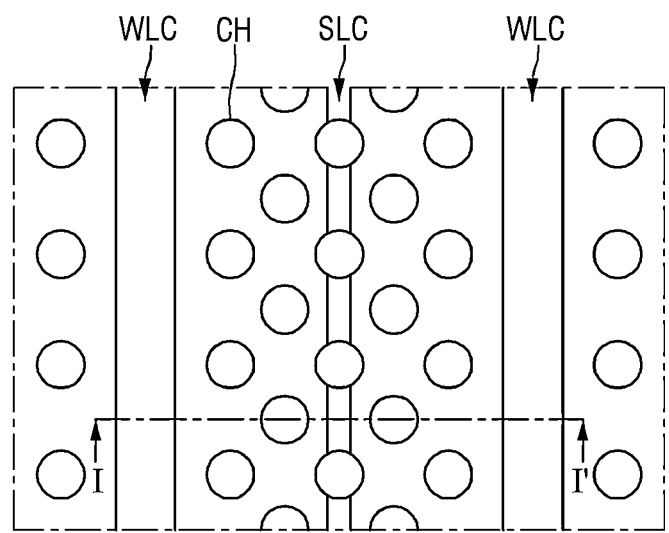
FIG. 4 is a schematic plan view showing a memory cell array of a semiconductor memory device according to some example embodiments of the present inventive concepts.
Figure 4:
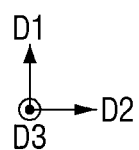

FIG. 3 is a circuit diagram showing one memory cell block among a plurality of memory cell blocks in a memory cell array according to some example embodiments of the present inventive concepts. FIG. 4 is a schematic plan view showing a memory cell array of a semiconductor memory device according to some example embodiments of the present inventive concepts.

Referring to FIG. 3, the memory cell array may include a common source line CSL, a plurality of bit lines BL, a plurality of string selection lines SSL, a plurality of memory cell strings CSTR disposed (e.g., arranged) between the common source line CSL and the bit lines BL, a plurality of GIDL lines GIDL, and a plurality of ground selection lines GSL.

The memory cell array may include a plurality of memory cells MC. Each of the memory cells MC may be connected to the plurality of word lines WL and the plurality of bit lines BL to operate. As an example, each of the memory cells MC may be connected to one word line WL and one bit line BL.

The plurality of memory cells MC may be connected in series to each other to provide one memory cell string CSTR.

The bit lines BL may be two-dimensionally arranged, and the plurality of memory cell strings CSTR may be connected in parallel to each of the bit lines BL. The common source line CSL may be an impurity region formed in the substrate SUB. The plurality of memory cell strings CSTR may be commonly connected to the common source line CSL. The plurality of cell strings CSTR may be disposed between the plurality of bit lines BL and the common source line CSL.

According to some example embodiments, the common source lines CSL may be provided in plural and arranged in two dimensions. Here, the same voltage may be electrically applied to the common source lines CSL, or each of the common source lines CSL may be electrically controlled.

Each of the memory cell strings CSTR may include a GIDL transistor GDT, a ground selection transistor GST, a string selection transistor SST, and a plurality of memory cell transistors MCT1 to MCTn. The plurality of memory cell transistors MCT1 to MCTn may be disposed between the ground selection transistor GST and the string selection transistor SST. The string selection transistor SST may be connected to one of the bit lines BL at the top of the memory cells MC in the memory cell string CSTR.

The GIDL transistor GDT may be connected to the common source line CSL at the bottom of the memory cells MC. The common source line CSL may be commonly connected to sources of the GIDL transistor GDT. According to some example embodiments, the GIDL transistor GDT may be connected to the bit line BL at the top of the string selection transistor SST.

The string selection transistor SST, the plurality of memory cell transistors MCT1 to MCTn, the ground selection transistor GST, and the GIDL transistor GDT may be connected in series.

The ground selection line GSL, the plurality of word lines WL1 to WLn, the plurality of string selection lines SSL, and the plurality of the GIDL lines GIDL that are disposed between the common source line CSL and the bit lines BL may be used as gate electrodes of the ground selection transistor GST, the memory cell transistors MCT1 to MCTn, the string selection transistors SST, and the GIDL transistors GDT, respectively. In addition, each of the memory cell transistors MCT1 to MCTn may include a data storage element.

As an example, the GIDL line GIDL, the ground selection line GSL, the word lines WL1 to WLn, and the string selection line SSL may be sequentially formed on the substrate SUB, and a mold insulation layer may be disposed on lower and/or upper portions of each of gate electrode layers. An area of the gate electrode layers may be decreased as a distance from the substrate SUB increases. A lower end portion of each of the word lines WL1 to WLn may operate as a dummy word line. The bit lines BL may be conductive patterns (e.g., metal lines) spaced apart from the substrate SUB and disposed on the substrate SUB.

Referring to FIGS. 3 and 4 together, the memory cell array may be separated by a word line cut region WLC. Also, the string selection line SSL among the gate electrode layers may be separated by a selection line cut region SLC. In some example embodiments, the word line cut region WLC may be provided in a structure in which one or more insulating materials are gap-filled. For example, such an insulating material may include at least one of silicon oxide, silicon nitride, and silicon oxynitride.

A plurality of channel structures CH may be formed so as to pass through the gate electrode layers and the insulating layers. The number and positions of the channel regions CH are not limited to those shown in FIG. 4 and may be variously modified.

In addition, the number of cell strings CSTR, the number of word lines WL1 to WLn, the number of bit lines BL, the number of ground selection lines GSL, the number of string selection lines SSL, and the number of GIDL lines GIDL may be variously changed according to some example embodiments.

The memory cell array according to some example embodiments of the present inventive concepts may include the GIDL transistors GDT that perform an erase operation of the memory cell array using a gate-induced drain leakage (GIDL) method. The GIDL transistors GDT may be disposed between the ground selection line GSL and the common source line CSL, which are also referred to as "lower GIDL transistors". In some example embodiments, the lower GIDL transistors may be provided in plural (e.g., two). In some example embodiments, at least one "upper GIDL transistor" may be further included between the string selection lines SSL and the bit lines BL.

Meanwhile, in some example embodiments, the GIDL transistors positioned at a lower end may act as gate electrodes for generating holes for the erase operation. For example, when a high voltage is applied to the common source line CSL and a GIDL voltage is applied to the GIDL line GIDL, a high electric field may occur in a channel region adjacent to the GIDL transistors GDT due to a potential difference between the high voltage and the GIDL voltage. Holes may be generated in the channel region by such a high electric field. The holes generated in the channel region are injected into a memory cell string, so that an erase operation of the plurality of memory cells may be performed.

According to some example embodiments of the present inventive concepts, when a high voltage is applied to the common source line, after the high voltage reaches a target voltage, an inhibition voltage may be applied to a part of the gate electrodes to intentionally generate a couple-up of a potential of the channel region.

Figure 5:
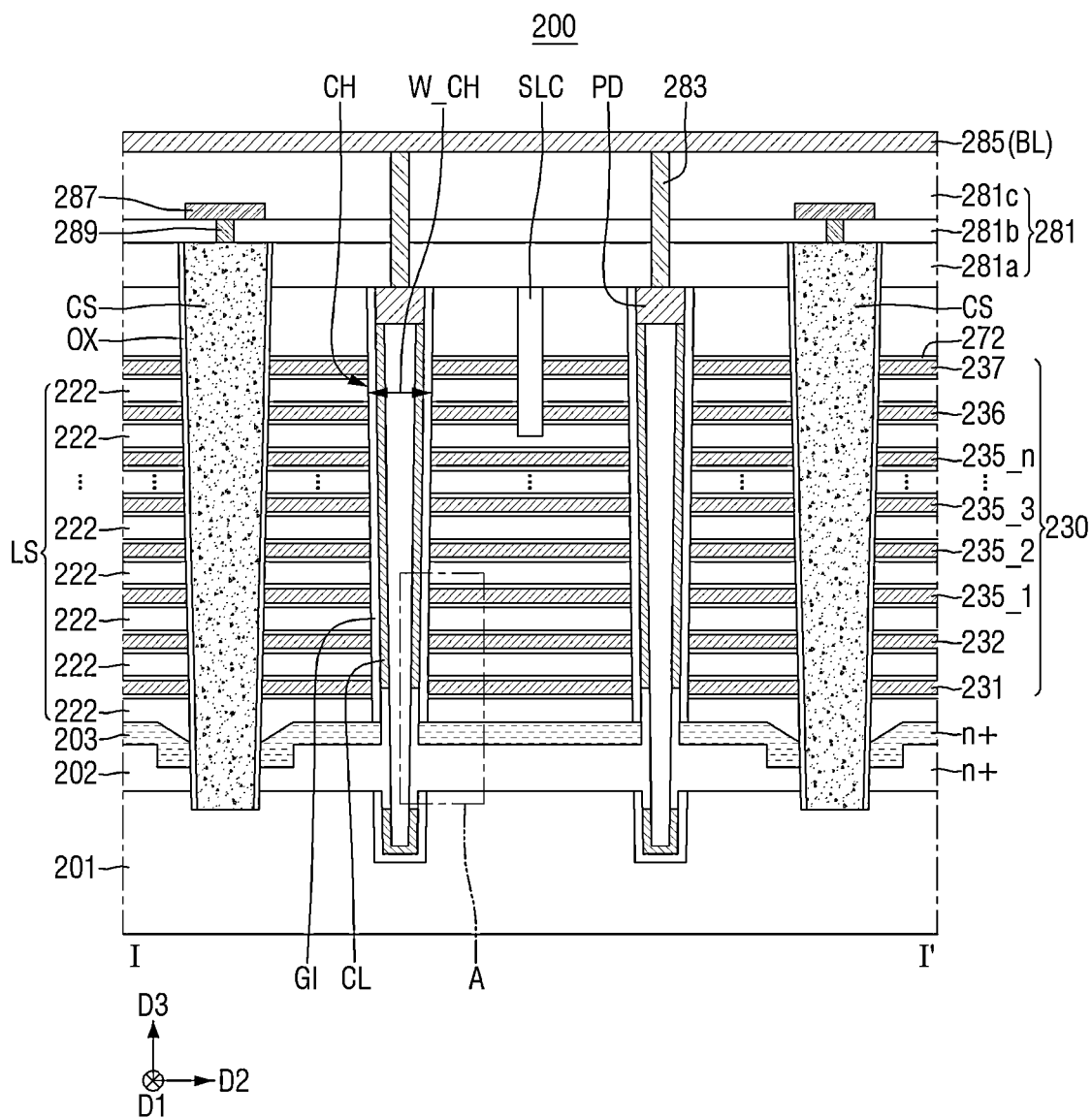
FIG. 5 is a cross-sectional view taken along line I-I' of the semiconductor memory device shown in FIG. 4.
Figure 6:
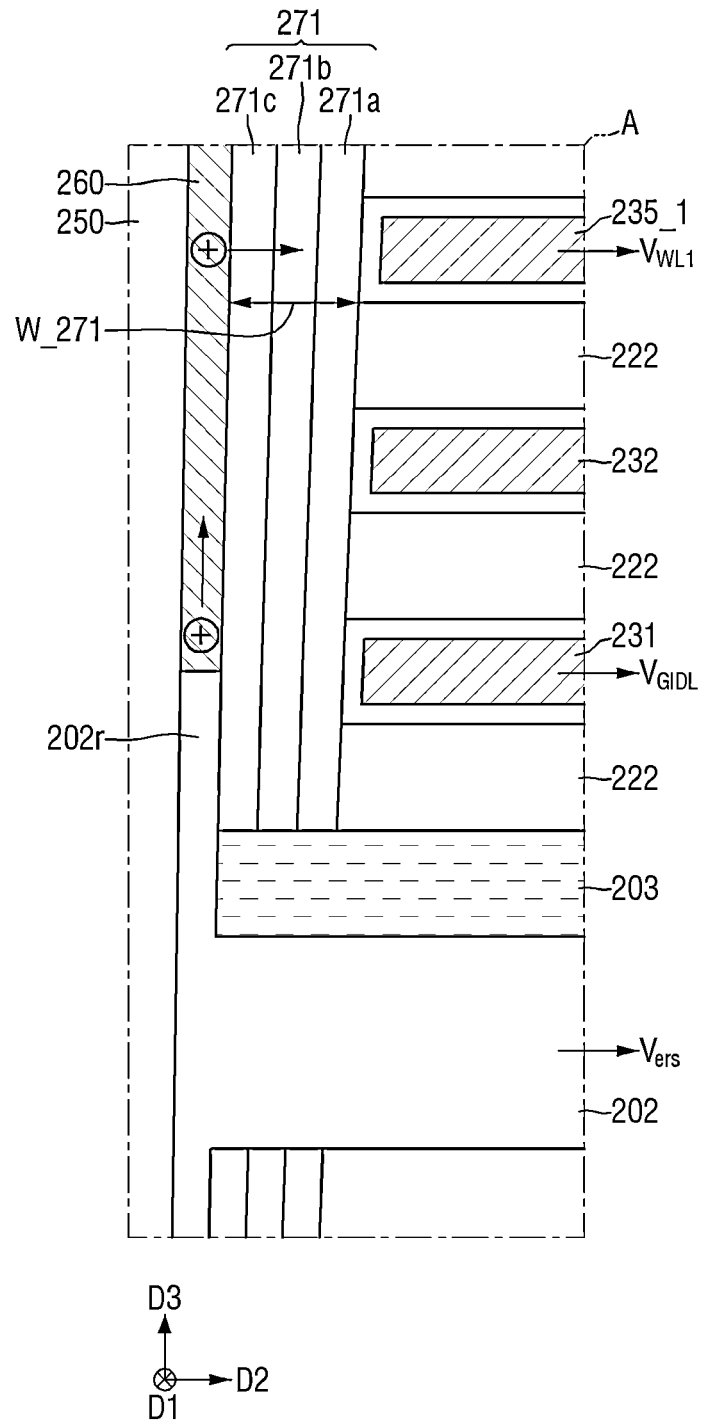
FIG. 6 is an enlarged cross-sectional view of region "A" in FIG. 5.

FIG. 5 is a cross-sectional view taken along line I-I' of the semiconductor memory device shown in FIG. 4. FIG. 6 is an enlarged cross-sectional view of region "A" in FIG. 5.

Referring to FIGS. 5 and 6, the semiconductor memory device 200 may include substrates 201, 202, and 203, a plurality of channel structures CH perpendicular to upper surfaces of the substrates 201, 202, and 203, and a plurality of stacked structures LS stacked on the substrates 201, 202, and 203 so as to be adjacent to the channel structure CH. The stacked structure LS may include a plurality of insulating layers 222 and a plurality of gate electrodes 230 that are alternately stacked on the substrates 201, 202, and 203. As shown, the gate electrodes 230 may be spaced apart from each other (e.g., isolated from direct contact with each other) in a direction that is perpendicular to an upper surface of a substrate, which may include one or more of substrates 201, 202, and 203 (e.g., third direction D3).

The substrates 201, 202, and 203 of the semiconductor memory device 200 according to some example embodiments of the present inventive concepts may include a first layer 201, a second layer 202, and a third layer 203. Each of the first layer 201, the second layer 202, and the third layer 203 may include polysilicon doped with first conductivity type impurities. For example, each of the first layer 201, the second layer 202, and the third layer 203 may be doped with an n-type impurity. Here, the first layer 201 may be a substrate, the second layer 202 may be a source layer, and the third layer 203 may be a support poly. In some example embodiments, the source layer 202 may be understood to be in a substrate (e.g., a substrate that includes at least the layers 201, 202, and 203). In the semiconductor memory device 200, a source layer 202 may include a common source extension region 202r extending along a vertical channel layer 260. For example, the common source extension region 202r may be formed to overlap a part of a GIDL line 231.

The plurality of gate electrode layers 230 may provide GIDL lines 231 and 237, a ground selection line 232, a string selection line 236, and a plurality of word lines 235_1 to 235_n. Each of the GIDL lines 231 and 237, the ground selection line 232, and the string selection line 236 may provide the GIDL transistor GDT, the ground selection transistor GST, and the string selection transistor SST of FIG. 3 along with the channel structure CH. The plurality of word lines 235_1 to 235_n may be disposed between the ground selection line 232 and the string selection line 236 and may provide the plurality of memory cell transistors MCT1 to MCTn along with the channel structure CH. Additional descriptions of the word lines 235_1 to 235_n will be described later in FIGS. 7A and 7B.

The plurality of gate electrode layers 230 may be divided into a plurality by a common source line CS and an insulating layer OX surrounding a side surface of the common source line CS. The common source line CS may be formed of a conductive material such as a metal, a metal compound, or polysilicon. The common source line CS may be electrically separated from the plurality of gate electrode layers 230 (also referred to herein as gate electrodes) by the insulating layer OX. A lower portion of the common source line CS in contact with the substrate 201 may be directly exposed to the substrate 201. Therefore, the common source line CS may be electrically connected to the source layer 202 and the support poly 203 formed on the substrate 201 through the substrate 201. As shown in the drawing, the common source line CS and the insulating layer OX may be included in the word line cut region WLC, but the present inventive concepts are not limited thereto.

According to some example embodiments, the plurality of insulating layers 222 may include at least one of a silicon film, a silicon oxide film, a silicon carbide film, a silicon oxynitride film, and a silicon nitride film. The plurality of gate electrodes 230 may include poly-Si or a metal such as tungsten (W) and/or a conductive metal nitride.

The stacked structure LS includes channel holes formed in a third direction D3 perpendicular to an upper surface of the substrate 201. The channel structure CH is provided inside the channel holes. The channel structure CH may include a vertical channel layer 260 passing through the stacked structure LS, a buried insulation layer 250 filling a space inside the vertical channel layer 260, and a vertical insulation layer 271 disposed between the vertical channel layer 260 and the plurality of gates electrodes 230.

The channel structure CH may be electrically connected to the source layer 202 and the support poly 203 formed on the substrate 201 through the substrate 201 by passing through the stacked structure LS. The channel structure CH may be provided in the stacked structure LS in plural, and the plurality of channel structures CH may be arranged in the first and second directions (e.g., D1 and D2) in a plan view. The plurality of channel structures CH may be arranged in a zigzag form as shown in FIG. 4.

The vertical channel layer 260 may have a columnar shape such as a cylinder or a prism without the buried insulation layer 250 according to some example embodiments. In addition, the channel structure CH may have an inclined side surface that becomes narrower as it gets closer to the substrate 201 depending on its aspect ratio. Therefore, a channel width W_CH in the second direction D2 of the channel structure CH increases as it is spaced apart from the substrate 201 in the third direction D3. The vertical channel layer 260 may include a semiconductor material such as polysilicon or single crystal silicon, and the semiconductor material may be a material that is not doped with impurities.

The vertical insulation layer 271 may include a tunnel insulation film 271c, a charge storage layer 271b, and a blocking insulation film 271a. At least a part of the blocking insulation film 271a may be formed in a shape surrounding the plurality of gate electrodes 230 to be provided as a blocking layer. A thickness W 271 of the vertical insulation layer 271 in the second direction D2 is increased while extending in the third direction D3 due to a step coverage in a process.

The tunnel insulation film 271c may be interposed between the charge storage layer 271b and the vertical channel layer 260. The blocking insulation film 271a may be interposed between the charge storage layer 271b and the gate electrodes 230. For example, the charge storage layer 271b may include at least one of a silicon nitride film, a silicon oxynitride film, a silicon-rich nitride film, a nanocrystalline silicon film, or a laminated trap layer. The tunnel insulation film 271c may include a material having a band gap larger than that of the charge storage layer 271b. As an example, the tunnel insulation film 271c may be a silicon oxide film. The blocking insulation film 271a may include a material having an energy band gap larger than that of the charge storage layer 271b. As an example, the blocking insulation film 271a may be a silicon oxide film, a silicon nitride film, and/or a silicon oxynitride film.

Interconnections (bit lines 285) crossing an upper surface of the stacked structure LS may be disposed on the stacked structure LS. The bit lines 285 may be connected to a pad PD positioned at an upper end of the channel structure CH through a first contact via 283. An interlayer insulation film 281 may be interposed between the bit lines 285 and the stacked structure LS, and the first contact via 283 may be formed passing through the interlayer insulation film 281. The interlayer insulation film 281 may include a first insulation film 281a disposed on the stacked structure LS so as to cover the pad PD of the channel structure CH, and a second insulation film 281b and a third insulation film 281c disposed on the first insulation film 281a so as to cover the channel structure CH.

The common source line CSL may pass through the first insulation film 281a, and a second contact via 289 may be formed passing through the second insulation film 281b at an upper end of the common source line CS. The common source line CS may receive a high voltage through a terminal 287 formed on the second insulation film 281b.

The semiconductor memory device 200 may apply a ground voltage to a word line and a high voltage to the common source line CS during the erase operation. In this case, a word line voltage may be coupled to the vertical channel layer 260 with the vertical insulation layer 271 interposed therebetween. The same ground voltage as the word line voltage may also be applied to the vertical channel layer adjacent to the word line due to a coupling effect.

FIG. 6 describes an erase operation of the memory cell block in the semiconductor memory device 200. A high voltage $V_{ers}$ of the common source line CS may be applied to the source layer 202 during the erase operation of the semiconductor memory device 200. For example, a target voltage of the high voltage $V_{ers}$ may be 18V to 20V. A GIDL voltage $V_{GIDL}$ may be applied to a GIDL line 231 during the erase operation of the semiconductor memory device 200. The GIDL voltage $V_{GIDL}$ may be applied while maintaining a constant potential difference with the voltage $V_{ers}$. A word line voltage $V_{WL}$ may be applied to a first word line 135-1 during the erase operation of the semiconductor memory device 200. For example, the word line voltage $V_{WL}$, may be 0V, which is the erase voltage when the erase operation is being performed.

Figure 7:
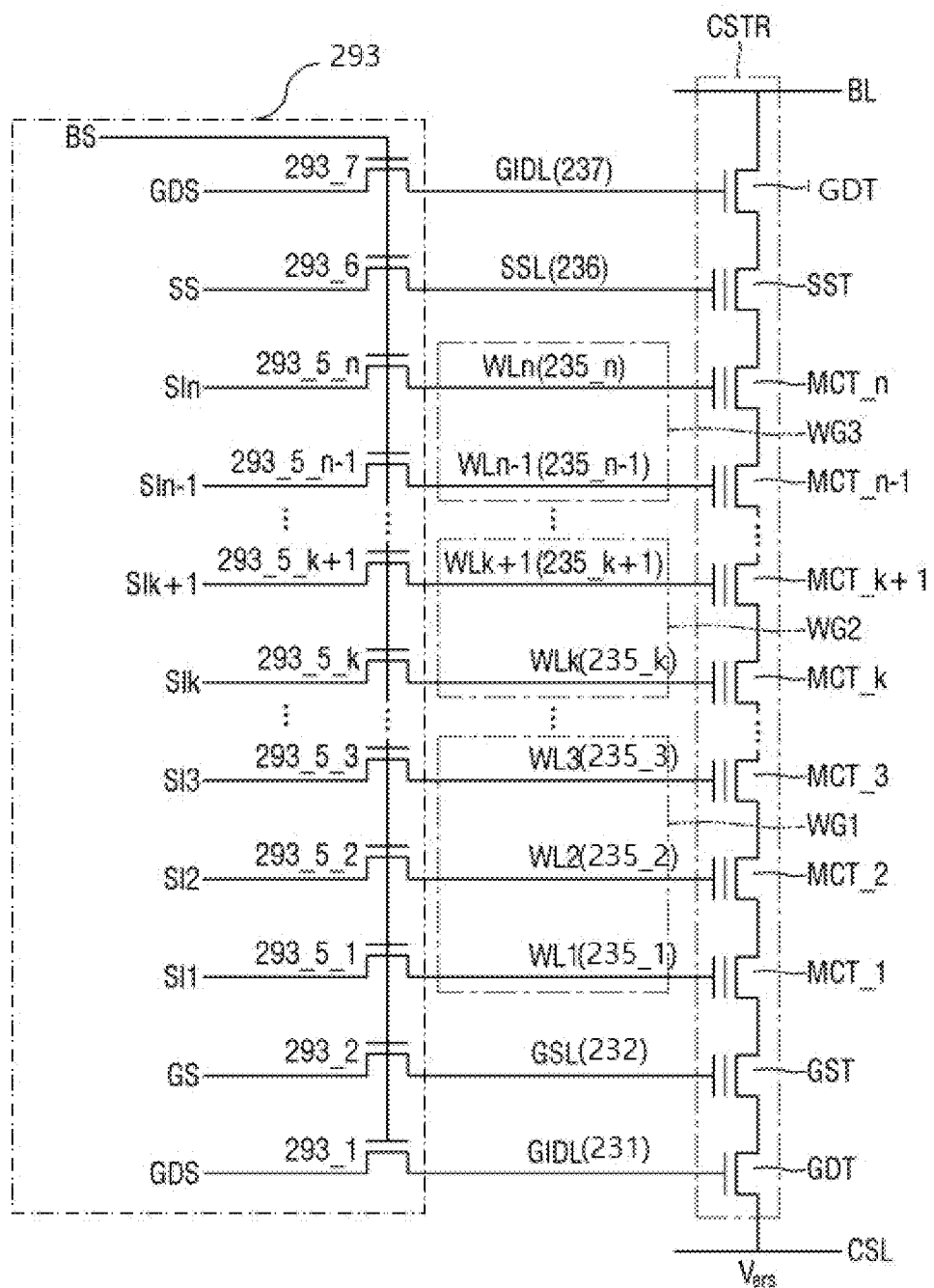
FIG. 7 is a circuit diagram showing a part of a cell string and a row decoder in a memory cell block according to some example embodiments of the present inventive concepts.
Figure 8:
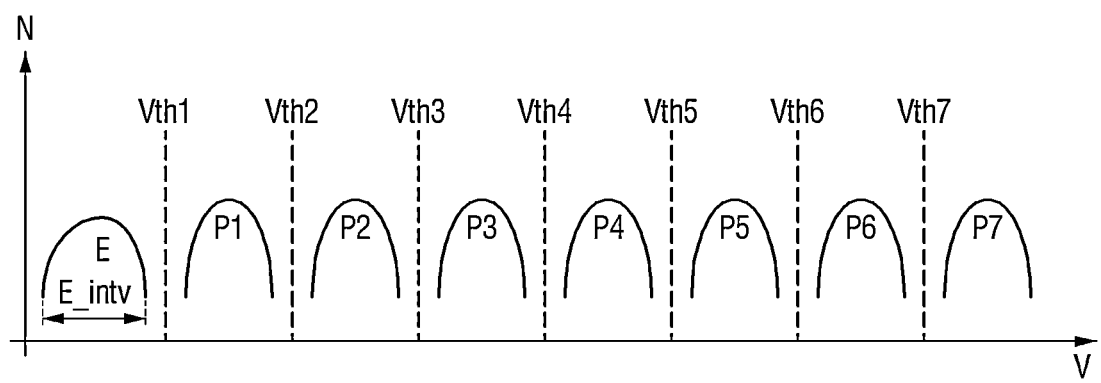
FIGS. 8 and 9 are views for describing a word line group in a plurality of gate electrode layers according to some example embodiments of the present inventive concepts.
Figure 9:
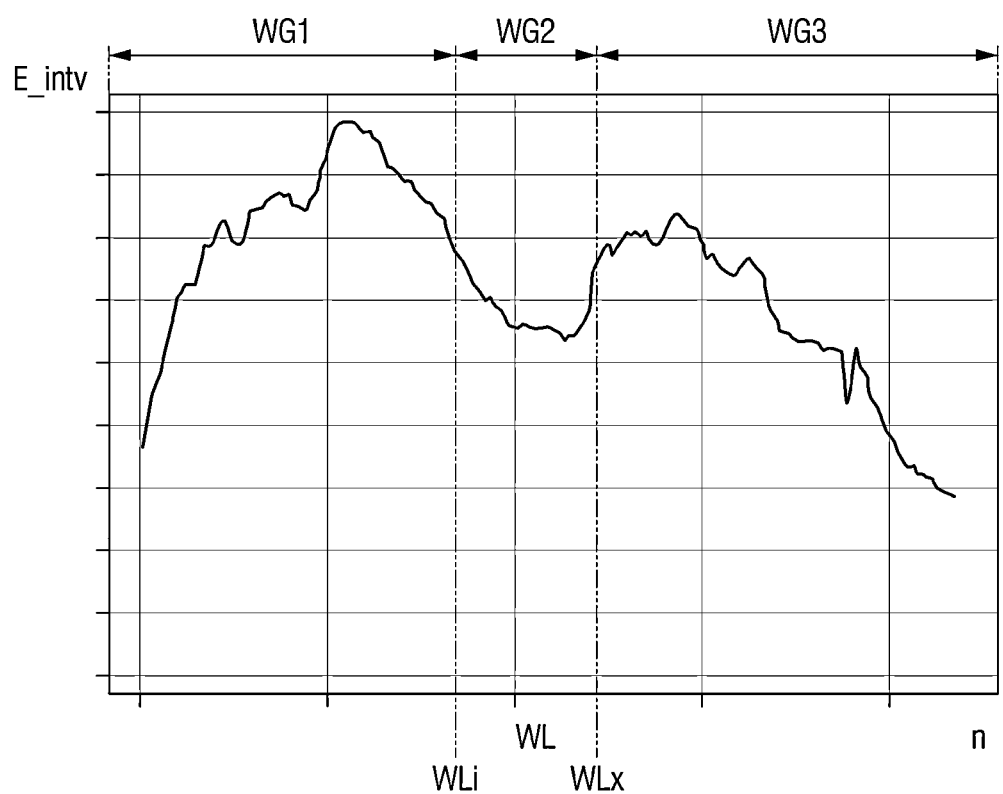

FIG. 7 is a circuit diagram showing a part of a cell string CSTR in the memory cell array 210 and a row decoder 293 according to some example embodiments of the present inventive concepts. FIGS. 8 and 9 are views for describing word line groups WG1 to WG3 in the plurality of gate electrode layers 230 according to some example embodiments of the present inventive concepts. FIGS. 8 and 9 describe a method of classifying the first to third word line groups WG1 to WG3 in the plurality of word lines 235_1 to 235_n according to some example embodiments.

Referring to FIGS. 5 and 7 to 9, the row decoder 293 includes a plurality of pass transistors 293_1 to 293_7. The number of pass transistors may be closely related to the number of gate electrode layers stacked in the memory cell block of the memory cell array 210 and changed depending on the number of gate electrode layers stacked in the memory cell block.

The plurality of pass transistors 293_1 to 293_7 may include GIDL pass transistors 293_1 and 293_7, a ground selection pass transistor 293_2, a plurality of word line pass transistors 293_5_1 to 293_5_n, and a string selection pass transistor 293_6.

One end of each of the GIDL pass transistors 293_1 and 293_7, the ground selection pass transistor 293_2, the plurality of word line pass transistors 293_5_1 to 293_5_n, and the string selection pass transistor 293_6 may be respectively connected to gates of the GIDL transistor GDT, the ground selection transistor GST, the plurality of memory cell transistors MCT_1 to MCT_n, and the string selection transistor SST through each of the GIDL lines 231 and 237, the ground selection line 232, the plurality of word lines 235_1 to 235_n, and the string selection line 236.

The other ends of the GIDL pass transistors 293_1 and 293_7, the ground selection pass transistor 293_2, the plurality of word line pass transistors 293_5_1 to 293_5_n, and the string selection pass transistor 293_6 may be respectively connected to GIDL gate driving signal lines GDS, a ground selection driving signal line GS, word line driving signal lines SI1 to SIn, and a string selection driving signal line SS that are included in the row decoder 293.

The same block signal BS is provided to the gates of the GIDL pass transistors 293_1 and 293_7, the ground selection pass transistor 293_2, the plurality of word line pass transistors 293_5_1 to 293_5_n, and the string selection pass transistor 293_6, so that the GIDL pass transistors 293_1 and 293_7, the ground selection pass transistor 293_2, the plurality of word line pass transistors 293_5_1 to 293_5_n, and the string selection pass transistor 293_6 may be controlled together by the block signal BS.

The plurality of word lines 235_1 to 235_n in the plurality of gate electrodes 230 according to some example embodiments include the first to third word line groups WG1, WG2, and WG3.

The first word line group WG1 includes first to third word lines WL1 to WL3 that are continuously disposed in the third direction D3 from the substrate 201. The second word line group WG2 includes kth to k+1th word lines WLk to WLk+1 that are continuously disposed in the third direction D3 from the substrate 201 on the first word line group WG1. The third word line group WG3 includes n−1th to nth word lines WLn−1 to WLn that are continuously disposed in the third direction D3 from the substrate 201 on the second word line group WG2.

The first to third word line groups WG1 to WG3 are sequentially stacked in the third direction D3 with respect to the substrate 201.

FIG. 8 illustrates voltage distributions of memory cells connected to one of the plurality of word lines 235_1 to 235_n. A horizontal axis of FIG. 8 may be defined as the voltage V of the memory cell, and a vertical axis of FIG. 8 may be defined as the number of memory cells. For convenience of description, it is assumed that the memory cell is the triple-level cell (TLC). The triple-level cell may have an erase state E or first to seventh program states P1 to P7 according to first to seventh threshold voltages Vth1 to Vth7.

The memory cells having the erase state E have an erase distribution width E_intv. As the erase distribution width E_intv increases, it means that the distribution of memory cells having the erase state E due to deep erase increases. The deep erased memory cells deteriorate data retention characteristics of adjacent memory cells, and as the erase distribution width E_intv of the word line increases, the reliability of the semiconductor memory device 200 deteriorates.

FIG. 9 illustrates an erase distribution width E_intv according to the plurality of word lines 235_1 to 235_n. A horizontal axis of FIG. 9 may be defined as a stacking order of the plurality of word lines 235_1 to 235_n with respect to the substrate 201, and a vertical axis of FIG. 9 may be defined as the erase distribution width E_intv.

As the stacking order increases from the lower end portion of the plurality of word lines 235_1 to 235_n, the erase distribution width E_intv increases, as the stacking order increases with respect to an ith word line WLi, the erase distribution width E_intv rapidly decreases, and as the stacking order increases with respect to an xth word line WLx, the erase distribution width E_intv rapidly increases, wherein i is greater than 3 and less than k, and x is greater than k+1 and less than n−1.

The first word line group WG1 may include a plurality of word lines continuously disposed from a first word line WL1 to the ith word line WLi, the second word line group WG2 may include a plurality of word lines continuously disposed from the ith word line WLi to the xth word line WLx, and the third word line group WG3 may include a plurality of word lines continuously disposed from the xth word line WLx to an nth word line WLn. According to the classification method, the erase distribution width E_intv of the word line included in the first word line group WG1 may be greater than the erase distribution width E_intv of the word line included in the second word line group WG2. In addition, the erase distribution width E_intv of the word line included in the third word line group WG3 may be greater than the erase distribution width E_intv of the word line included in the second word line group WG2.

In addition, the third word line group WG3 is disposed higher from the substrate 201 than the first and second word line groups WG1 and WG2, so that the thickness in the second direction D2 with respect to the vertical insulation layer 271 of the memory cell in the third word line group WG3 is greater than the thickness in the second direction D2 with respect to the vertical insulation layer 271 of the memory cells in the first and second word line groups WG1 and WG2.

In FIG. 9, the word line groups WG1 to WG3 are classified with respect to the erase distribution width E_intv, but the example does not limit the technical spirit of the present inventive concepts, and the word line groups WG1 to WG3 may be classified with respect to the threshold voltage Vth data, the program voltage, the erase voltage, and the voltage application time of memory cells stored in the information memory cell block iBLK of FIGS. 1 and 2.

Figure 10:
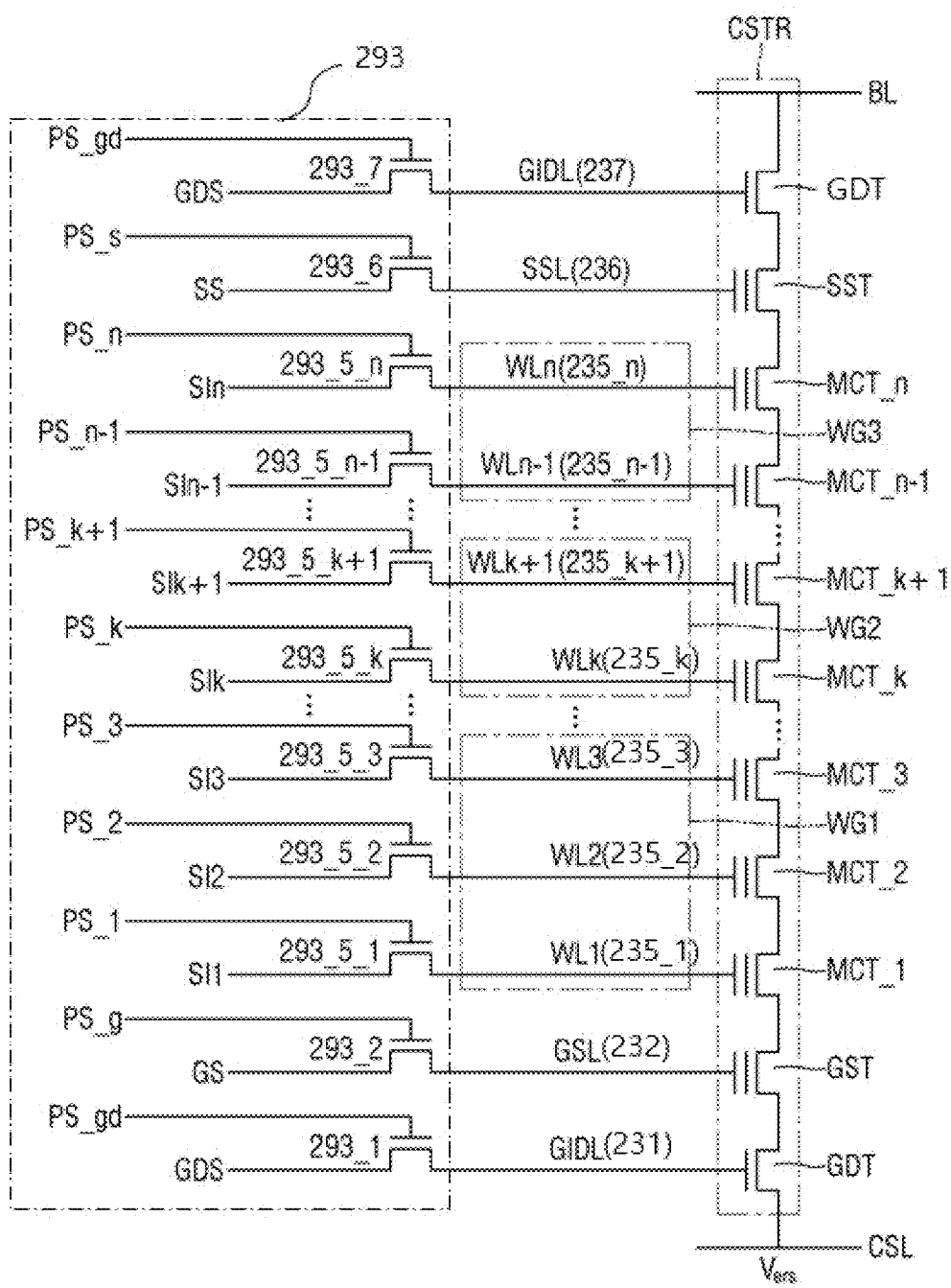
FIG. 10 is a circuit diagram showing a part of a cell string and a row decoder in a memory cell block according to some example embodiments of the present inventive concepts.

FIG. 10 is a circuit diagram showing a part of a cell string in a memory cell block and a row decoder according to some example embodiments of the present inventive concepts. For convenience of description, points different from those described in FIG. 7 will be mainly described with reference to FIG. 10.

The gates of the GIDL pass transistors 293_1 and 293_7, the ground selection pass transistor 293_2, the plurality of word line pass transistors 293_5_1 to 293_5_n, and the string selection pass transistor 293_6 are electrically isolated from each other.

A GIDL pass signal PS_gd, a ground selection pass signal PS_g, a plurality of word line pass signals PS_1 to PS_n, and a string selection pass signal PS_s are respectively input to the gates of the GIDL pass transistors 293_1 and 293_7, the ground selection pass transistor 293_2, the plurality of word line pass transistors 293_5_1 to 293_5_n, and the string selection pass transistor 293_6.

The GIDL pass transistors 293_1 and 293_7, the ground selection pass transistor 293_2, the plurality of word line pass transistors 293_5_1 to 293_5_n, and the string selection pass transistor 293_6 may be individually controlled.

Figure 11:
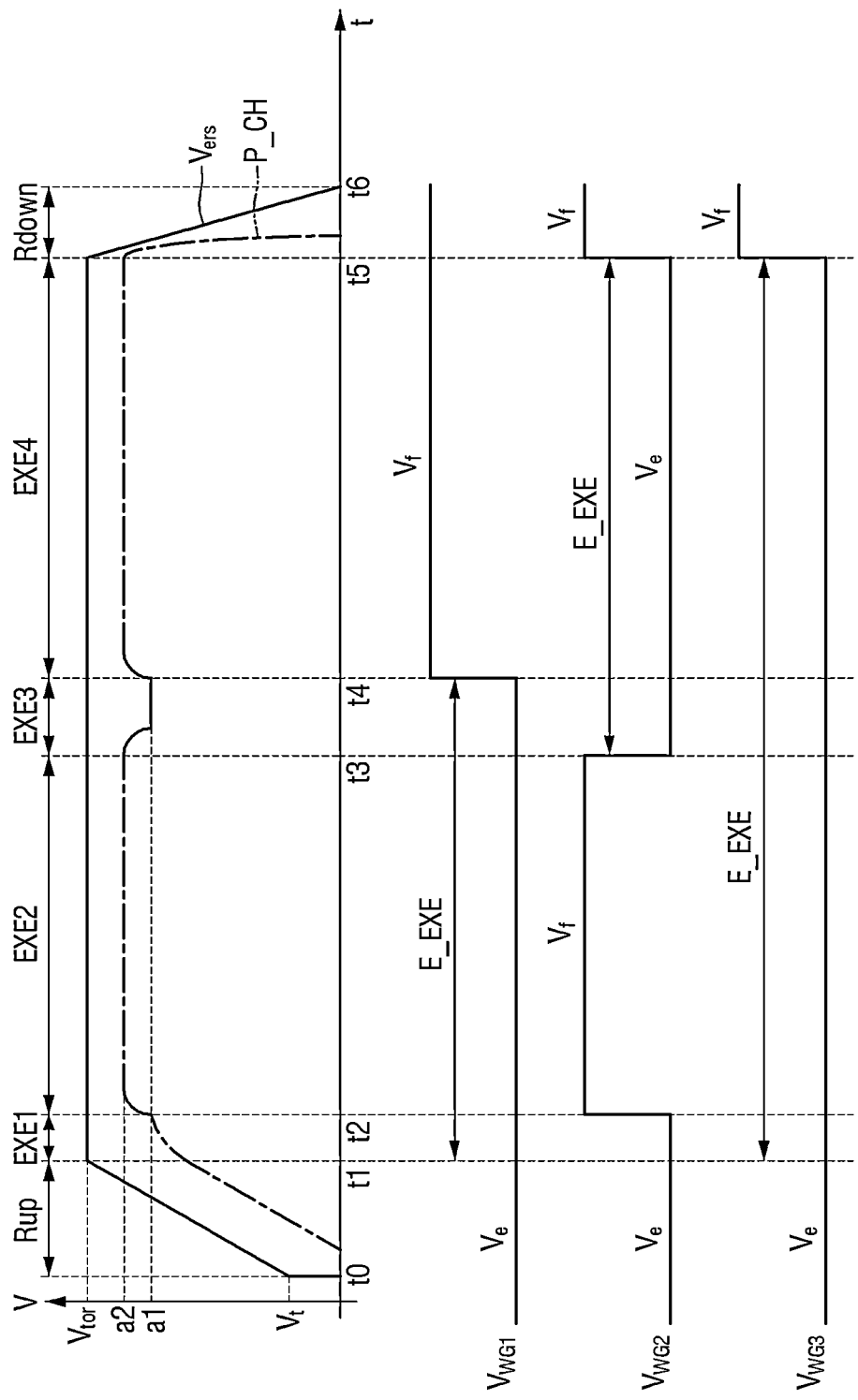
FIG. 11 is a view for describing an erase operation of a memory cell block according to some example embodiments of the present inventive concepts.

FIG. 11 is a view for describing an erase operation of a memory cell block according to some example embodiments of the present inventive concepts.

Referring to FIGS. 7 and 11, the voltage $V_{ers}$ of the common source line CSL is transitioned to a transition voltage $V_t$ at a zeroth time t0, and the voltage $V_{ers}$ of the common source line CSL rises to a target voltage $V_{tar}$ during a ramp-up interval Rup (t0 to t1). As the voltage $V_{ers}$ of the common source line CSL rises, a channel potential P_CH of the vertical channel layer 260 of FIG. 5 rises. At the zeroth time t0, voltages $V_{WG1}$ to $V_{WG3}$ of the word lines in the first to third word line groups WG1 to WG3 may be the ground voltage (e.g., 0V) as an erase voltage $V_e$.

After the voltage $V_{ers}$ of the common source line CSL reaches the target voltage $V_{tar}$ at a first time t1, the voltage $V_{ers}$ of the common source line CSL is maintained at the target voltage $V_{tar}$, and the channel potential P_CH rises to a convergence potential level a1 during a first execution interval EXE1 (t1 to t2).

After the channel potential P_CH reaches the convergence potential level a1 at a second time t2, a voltage $V_{WG2}$ of the word line in the second word line group WG2 rises to an inhibition voltage $V_f$ by the plurality of word line pass transistors 293_5_1 to 293_5_n and the plurality of word line driving signal lines SI1 to SIn during a second execution interval EXE2 (t2 to t3). As the voltage $V_{WG2}$ rises to the inhibition voltage $V_f$, the channel potential P_CH also rises to a couple-up potential a2 in the second execution interval EXE2 (t2 to t3).

The inhibition voltage $V_f$ is higher than the erase voltage $V_e$, and when the inhibition voltage $V_f$, which is a high voltage, is applied, a potential difference between the word line and the channel potential P_CH in the second word line group WG2 may be relatively small. Therefore, due to the relatively small potential difference, a potential difference required for the charge trapped in the charge storage layer 271b (see FIG. 6) to be de-trapped may not be formed and the charges may not be discharged.

The voltage $V_{WG2}$ of the word line in the second word line group WG2 drops to the erase voltage $V_e$ at a third time t3, and the voltage $V_{WG2}$ of the word line in the second word line group WG2 is maintained as the erase voltage $V_e$ during a third execution interval EXE3 (t3 to t4). As the voltage $V_{WG2}$ drops to the erase voltage $V_e$, the channel potential P_CH in the third execution interval EXE3 (t3 to t4) also drops to the convergence potential level a1.

The voltage $V_{WG1}$ of the word line in the first word line group WG1 rises to the inhibition voltage $V_f$ by the plurality of word line pass transistors 293_5_1 to 293_5_n and the plurality of word line driving signal lines SI1 to SIn at a fourth time t4. The voltage $V_{WG1}$ of the word line in the first word line group WG1 is maintained as the inhibition voltage $V_f$ during a fourth execution interval EXE4 (t4 to t5). As the voltage $V_{WG1}$ rises to the inhibition voltage $V_f$, the channel potential P_CH also rises to the couple-up potential a2 in the fourth execution interval EXE4 (t4 to t5).

As shown in at least FIG. 11, the semiconductor memory device 200 may be configured to, in response to the voltage $V_{ers}$ of the common source line CSL reaching a target voltage $V_t$, cause an inhibition voltage $V_f$ to be applied to the second word line group WG2 and an erase voltage $V_e$ to be applied to the first word line group WG1 in a first interval (e.g., EXE2) during the erase operation, and cause the inhibition voltage $V_f$ to be applied to the first word line group WG1 and the erase voltage $V_e$ to be applied to the second word line group WG2 in a second interval (e.g., EXE4) after the first interval during the erase operation. As shown, the semiconductor memory device 200 may be configured to cause the erase voltage $V_e$ to be applied to the third word line group WG3 in the first and second intervals during the erase operation. As shown, the semiconductor memory device 200 may be configured to cause a channel potential P_CH of the vertical channel layer 260 to be increased in response to a time point at which the inhibition voltage $V_f$ is applied to the second word line group WG2 (e.g., t2). As shown, the semiconductor memory device 200 may be configured to cause the channel potential P_CH to be lowered between a time point of applying the erase voltage $V_e$ to the second word line group WG2 (e.g., t3) and a time point of applying the inhibition voltage $V_f$ to the first word line group WG1 (e.g., t4).

The voltages $V_{WG1}$ to $V_{WG3}$ of the word lines in the first to third word line groups WG1 to WG3 rise to the inhibition voltage $V_f$ after a fifth time t5, and the voltage $V_{ers}$ of the common source line CSL drops to the ground voltage during a ramp-down interval Rdown (t5 to t6), and accordingly, the channel potential P_CH also drops.

An erase operation is performed on all of the plurality of word lines 235_1 to 235_n from the zeroth time to the sixth time t0 to t6. When a relatively low erase voltage $V_e$ is applied to the word line, a potential difference between the voltages of the plurality of word lines 235_1 to 235_n and the voltage of the channel potential P_CH may be relatively large. Therefore, due to the relatively large potential difference, the charge trapped in the charge storage layer 271b (see FIG. 6) may be de-trapped and discharged to the substrate 201 through the vertical channel layer 260.

Among the entire erase operation, an erase execution E_EXE is performed on the word line in the first word line group WG1 during the first to third execution intervals EXE1 to EXE3. The word line in the first word line group WG1 performs the erase execution E_EXE based on the convergence potential level a1 and the erase voltage $V_e$ during the first execution interval EXE1. The word line in the first word line group WG1 performs the erase execution E_EXE based on the couple-up potential a2 and the erase voltage $V_e$ during the second execution interval EXE2. The word line in the first word line group WG1 performs the erase execution E_EXE based on the convergence potential level a1 and the erase voltage $V_e$ during the third execution interval EXE3.

Among the entire erase operation, an erase execution E_EXE is performed on the word line in the second word line group WG2 during the third and fourth execution intervals EXE3 and EXE4. The word line in the second word line group WG2 performs the erase execution E_EXE based on the convergence potential level a1 and the erase voltage $V_e$ during the third execution interval EXE3. The word line in the second word line group WG2 performs the erase execution E_EXE based on the couple-up potential a2 and the erase voltage $V_e$ during the fourth execution interval EXE4.

Among the entire erase operation, an erase execution E_EXE is performed on the word line in the third word line group WG3 during the first to fourth execution intervals EXE1 to EXE4. The word line in the third word line group WG3 performs the erase execution E_EXE based on the couple-up potential a2 and the erase voltage $V_e$ during the second execution interval EXE2. The word line in the third word line group WG3 performs the erase execution E_EXE based on the convergence potential level a1 and the erase voltage $V_e$ during the third execution interval EXE3. The word line in the third word line group WG3 performs the erase execution E_EXE based on the couple-up potential a2 and the erase voltage $V_e$ during the fourth execution interval EXE4.

Figure 12:
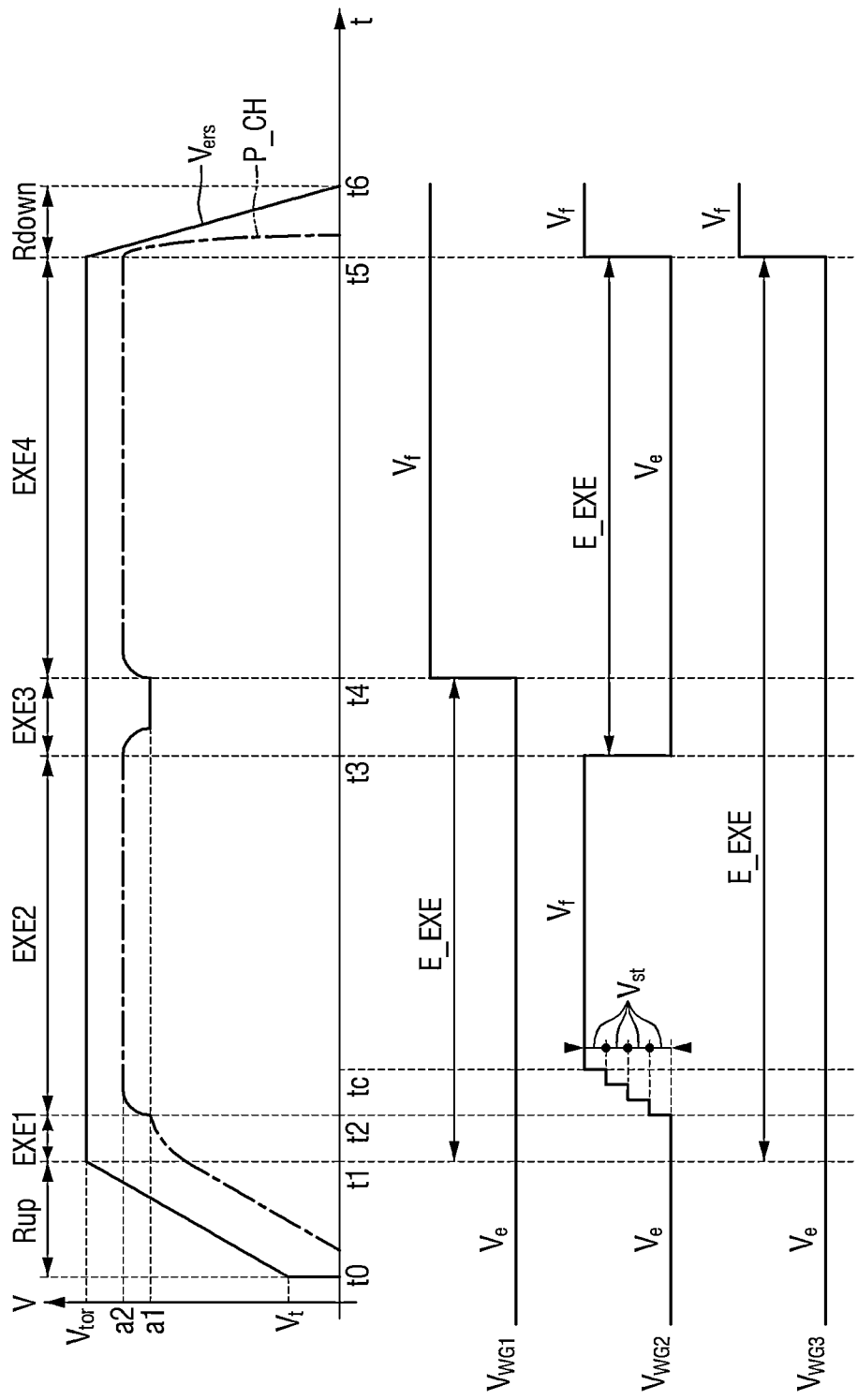
FIG. 12 is a view for describing an erase operation of a memory cell block according to still some example embodiments of the present inventive concepts.

FIG. 12 is a view for describing an erase operation of a memory cell block according to still some example embodiments of the present inventive concepts. For convenience of description, points different from those described in FIG. 11 will be mainly described with reference to FIG. 12.

After the channel potential P_CH reaches the convergence potential level a1 at the second time t2, the voltage $V_{WG2}$ of the word line in the second word line group WG2 rises to the inhibition voltage $V_f$ in a step-up form of a unit voltage Vst during the second execution interval EXE2 (t2 to t3). The voltage $V_{WG2}$ of the word line in the second word line group WG2 rises as much as the unit voltage Vst at regular time intervals and rises to the inhibition voltage $V_f$ at a time tc reached in the second execution interval EXE2 (t2 to t3).

Figure 13:
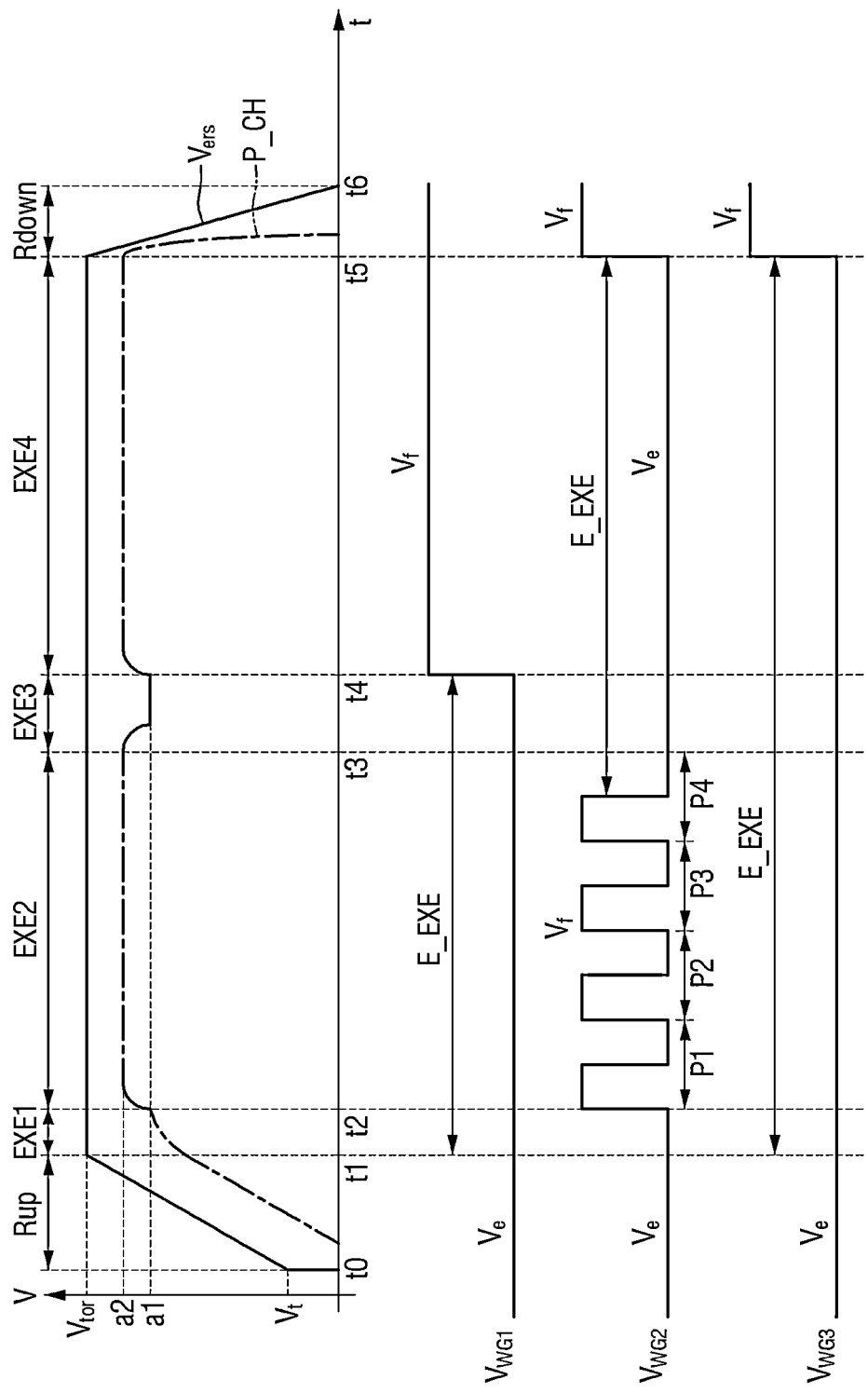
FIG. 13 is a view for describing an erase operation of a memory cell block according to yet some example embodiments of the present inventive concepts.

FIG. 13 is a view for describing an erase operation of a memory cell block according to yet some example embodiments of the present inventive concepts. For convenience of description, points different from those described in FIG. 11 will be mainly described with reference to FIG. 13.

After the channel potential P_CH reaches the convergence potential level a1 at the second time t2, the voltage $V_{WG2}$ of the word line in the second word line group WG2 rises to the inhibition voltage $V_f$ in a form of pulses P1 to P4 (also referred to herein as pulse waves) having a constant period during the second execution interval EXE2 (t2 to t3). The voltage $V_{WG2}$ of the word line in the second word line group WG2 rises to the inhibition voltage $V_f$ while repeating between the inhibition voltage $V_f$ and the erase voltage $V_e$ at the constant period.

Figure 14:
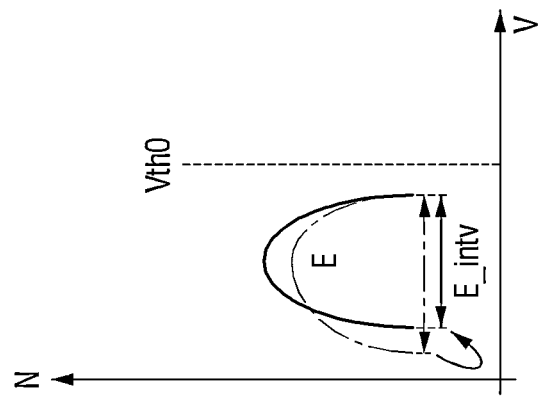
FIGS. 14 and 15 are graphs for describing an effect of the semiconductor memory device according to some example embodiments of the present inventive concepts.
Figure 15:
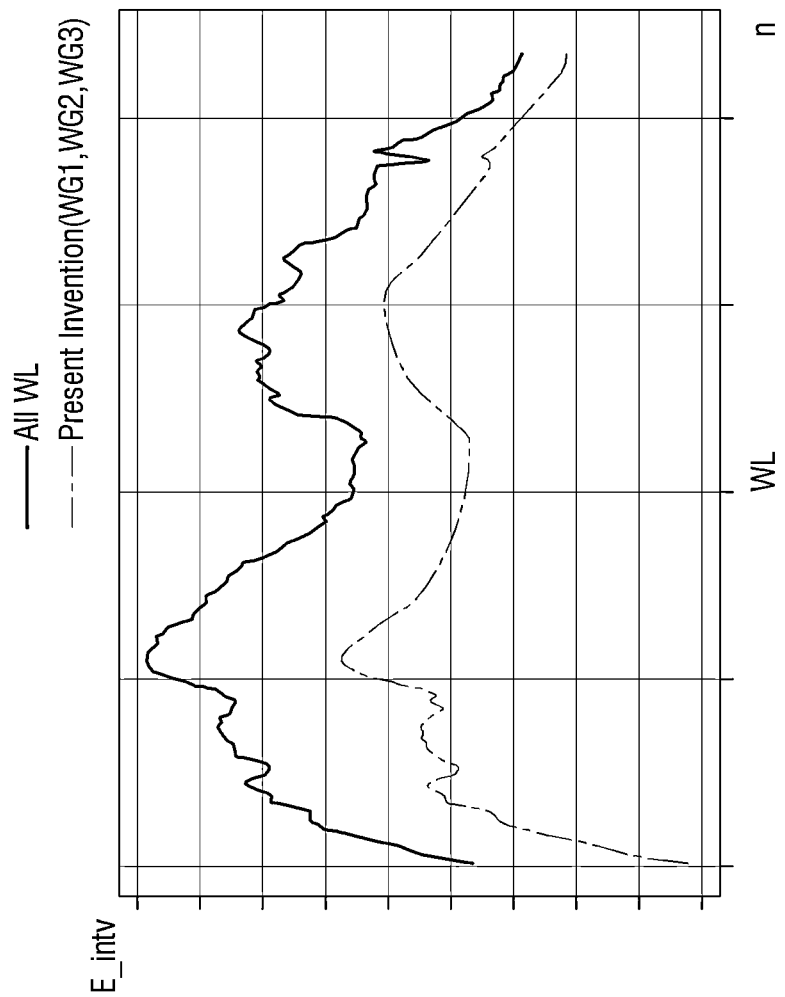

FIGS. 14 and 15 are graphs for describing an effect of the semiconductor memory device according to some example embodiments of the present inventive concepts.

Referring to FIGS. 7, 11, 14, and 15, the entire erase operation of the semiconductor memory device 200, which the semiconductor memory device 200 may be configured to perform, may reduce the erase distribution width E_intv of memory cells by dividing word line groups and applying the inhibition voltage to increase the channel potential P_CH to perform the erase execution E_EXE.

In addition, the erase execution E_EXE may be continuously performed while the erase operation is performed (t0 to t6) for the word line in the third word line group WG3 disposed at the top. In the case of the word line in the third word line group WG3, since a thickness of the vertical insulation layer 271 is greater than the word lines in other word line groups, the erase operation operates reliably, and it requires more erase operation time than word lines in other word line groups in order to reduce the erase distribution width E_intv of the memory cells. The entire erase operation of the semiconductor memory device 200 reflects structural characteristics of the channel structure.

The erase distribution width E_intv of the memory cells in the semiconductor memory device 200 is reduced through the entire erase operation (which the semiconductor memory device 200 may be understood to be configured to perform), and data retention characteristics of adjacent memory cells are improved through the erase distribution width E_intv, thereby improving the reliability of the overall semiconductor memory device 200. Accordingly, the semiconductor memory device 200 may be configured to have improved reliability based on being configured to perform an erase operation according to any of the example embodiments.

Figure 16:
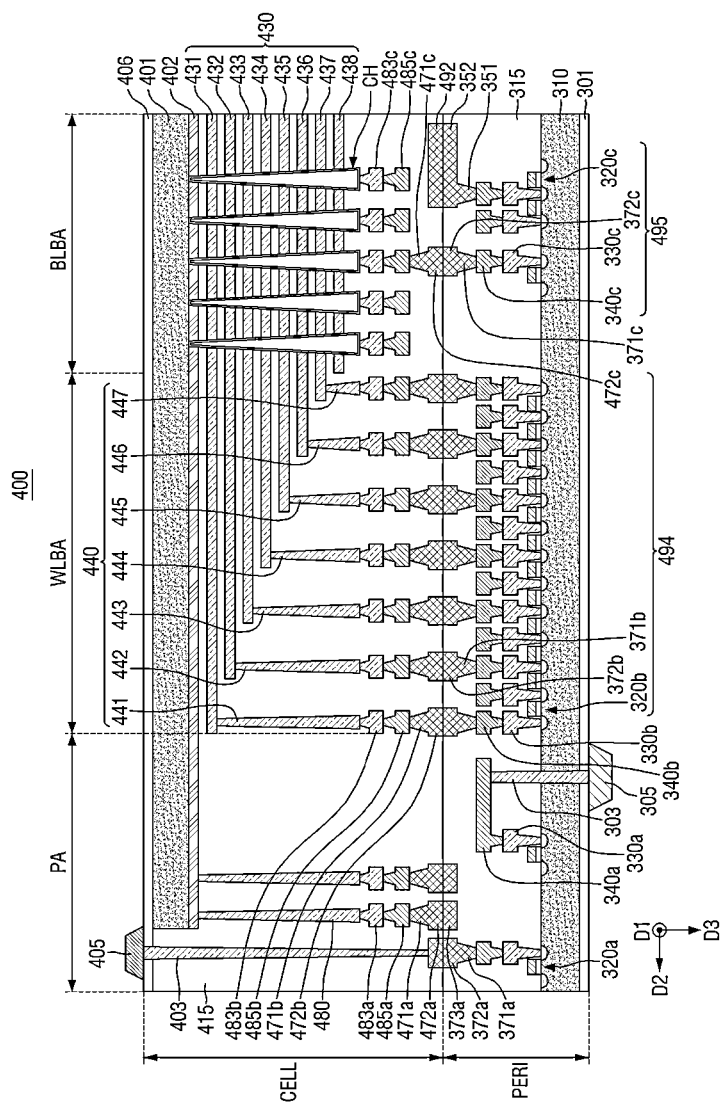
FIG. 16 is a view for describing a three-dimensional (3D) V-NAND structure that may be applied to the semiconductor memory device according to some example embodiments of the present inventive concepts.

FIG. 16 is a view for describing a three-dimensional (3D) V-NAND structure that may be applied to a semiconductor memory device 400 according to some example embodiments of the present inventive concepts.

The semiconductor memory device 400 may have a chip to chip (C2C) structure. The C2C structure may refer that an upper chip including a cell region CELL is fabricated on a first wafer, a lower chip including a peripheral circuit region PERI is fabricated on a second wafer different from the first wafer, and then the upper chip and the lower chip are connected to each other by a bonding method. As an example, the bonding method may refer to a method of electrically connecting a bonding metal formed in the uppermost metal layer of the upper chip and a bonding metal formed in the uppermost metal layer of the lower chip to each other. For example, when the bonding metal is formed of copper (Cu), the bonding method may be a Cu—Cu bonding method, and the bonding metal may be formed of aluminum or tungsten.

Each of the peripheral circuit region PERI and the cell region CELL of the semiconductor memory device 400 may include an external pad bonding region PA, a word line bonding region WLBA, and a bit line bonding region BLBA. The peripheral circuit region PERI may include a first substrate 310, an interlayer insulating layer 315, a plurality of circuit elements 320a, 320b, and 320c formed on the first substrate 310, first metal layers 330a, 330b, and 330c respectively connected to the plurality of circuit elements 320a, 320b, and 320c, and second metal layers 340a, 340b, and 340c formed on the first metal layers 330a, 330b, and 330c. In some example embodiments, the first metal layers 330a, 330b, and 330c may be formed of tungsten having relatively high resistance, and the second metal layers 340a, 340b, and 340c may be formed of copper having relatively low resistance.

In the present inventive concepts, only the first metal layers 330a, 330b, and 330c and the second metal layers 340a, 340b, and 340c are shown and described, but the present inventive concepts are not limited thereto. At least one metal layer may be further formed on the second metal layers 340a, 340b, and 340c. At least some of one or more metal layers formed on the second metal layers 340a, 340b, and 340c may be formed of aluminum having a resistance lower than that of copper forming the second metal layers 340a, 340b, and 340c.

The interlayer insulating layer 315 may be disposed on the first substrate 310 so as to cover the plurality of circuit elements 320a, 320b, and 320c, the first metal layers 330a, 330b, and 330c, and the second metal layers 340a, 340b, and 340c and may include an insulating material such as silicon oxide, silicon nitride, or the like.

Lower bonding metals 371b and 372b may be formed on the second metal layer 340b of the word line bonding region WLBA. In the word line bonding region WLBA, the lower bonding metals 371b and 372b of the peripheral circuit region PERI may be electrically connected to upper bonding metals 471b and 472b of the cell region CELL by the bonding method, and the lower bonding metals 371b and 372b and the upper bonding metals 471b and 472b may be formed of aluminum, copper, tungsten, or the like. The upper bonding metals 471b and 472b of the cell region CELL may be referred to as first metal pads, and the lower bonding metals 371b and 372b of the peripheral circuit region PERI may be referred to as second metal pads.

The cell region CELL may provide at least one memory block. The cell region CELL may include a second substrate 401 and a common source line 402. A plurality of gate electrode layers 430 (431 to 438) may be stacked on the second substrate 401 in the direction D3 perpendicular to an upper surface of the second substrate 401. The plurality of gate electrode layers 430 may include a word line, and string selection lines and a ground selection line disposed above and below the word lines, respectively, and a plurality of word lines may be disposed between the string selection lines and the ground selection line. The second substrate 401 and the common source line 402 may correspond to the substrate 201 and the source layer 202 of FIG. 5.

In the bit line bonding region BLBA, the channel structure CH may extend in a direction perpendicular to the upper surface of the second substrate 401 and pass through the plurality of gate electrode layers 430. The channel structure CH may include a charge storage layer, a vertical channel layer, a buried insulating layer, and the like. The vertical channel layer may be electrically connected to a first metal layer 483c and a second metal layer 485c. For example, the first metal layer 483c may be a bit line contact, and the second metal layer 485c may be a bit line. In some example embodiments, the bit line may extend in a first direction D1 parallel to the upper surface of the second substrate 401.

In some example embodiments shown in FIG. 16, a region where the channel structure CH and the bit line are disposed may be defined as the bit line bonding region BLBA. The bit line may be electrically connected to the circuit elements 320c providing a page buffer 495 in the peripheral circuit region PERI in the bit line bonding region BLBA. As an example, the bit line may be connected to upper bonding metals 471c and 472c, and the upper bonding metals 471c and 472c may be connected to lower bonding metals 371c and 372c connected to the circuit elements 320c of the page buffer 495 in the peripheral circuit region PERI.

In the word line bonding region WLBA, word lines 430 may extend in a second direction D2 parallel to an upper surface of a second substrate 401 and include a plurality of cell contact plugs 440 (441 to 447). The plurality of gate electrode layers 430 (431 to 438) and the cell contact plugs 440 may be connected to each other through pads provided by at least a part of the plurality of gate electrode layers 430 extending to have different lengths in the second direction D2. A first metal layer 483b and a second metal layer 485b may be sequentially connected to upper portions of the cell contact plugs 440 connected to the plurality of gate electrode layers 430. In the word line bonding region WLBA, the cell contact plugs 440 may be connected to the peripheral circuit region PERI through the upper bonding metals 471b and 472b of the cell region CELL and the lower bonding metals 371b and 372b of the peripheral circuit region PERI.

The cell contact plugs 440 may be electrically connected to the circuit elements 320b providing a row decoder 494 in the peripheral circuit region PERI. In some example embodiments, operating voltages of the circuit elements 320b providing the row decoder 494 may be different from operating voltages of the circuit elements 320c providing the page buffer 495. As an example, the operating voltages of the circuit elements 320c providing the page buffer 495 may be greater than the operating voltages of the circuit elements 320b providing the row decoder 494.

A common source line contact plug 480 may be disposed in the external pad bonding region PA. The common source line contact plug 480 may be formed of a conductive material such as a metal, a metal compound, or polysilicon, and electrically connected to the common source line 402. A first metal layer 483a and a second metal layer 485a may be sequentially stacked on the common source line contact plug 480 and may be connected to upper bonding metal 471a. As an example, a region where the common source line contact plug 480, the first metal layer 483a, and the second metal layer 485a are disposed may be defined as the external pad bonding region PA.

Meanwhile, input/output pads 305 and 405 may be disposed in the external pad bonding region PA. Referring to FIG. 16, a lower insulating layer 301 covering a lower surface of the first substrate 310 may be formed under the first substrate 310, and a first input/output pad 305 may be formed on the lower insulating layer 301. The first input/output pad 305 may be connected to at least one of the plurality of circuit elements 320a, 320b and 320c disposed in the peripheral circuit region PERI through a first input/output contact plug 303 and may be separated from the first substrate 310 by the lower insulating layer 301. In addition, a side insulating layer may be disposed between the first input/output contact plug 303 and the first substrate 310 to electrically separate the first input/output contact plug 303 from the first substrate 310.

Referring to FIG. 16, an upper insulating film 406 covering the upper surface of the second substrate 401 may be formed on the second substrate 401, and a second input/output pad 405 may be formed on the upper insulating film 406. The second input/output pad 405 may be connected to at least one of the plurality of circuit elements 320a, 320b, and 320c disposed in the peripheral circuit region PERI through a second input/output contact plug 403.

In some example embodiments, the second substrate 401 and the common source line 402 may not be disposed in a region where the second input/output contact plug 403 is disposed. Also, the second input/output pad 405 may not overlap the plurality of gate electrode layers 430 in the third direction D3. Referring to FIG. 16, the second input/output contact plug 403 may be separated from the second substrate 401 in a direction parallel to the upper surface of the second substrate 401 and may pass through an interlayer insulating layer 415 of the cell region CELL to be connected to the second input/output pad 405.

In some example embodiments, the first input/output pad 305 and the second input/output pad 405 may be selectively formed. As an example, the semiconductor memory device 400 may include only the first input/output pad 305 disposed on the first substrate 310 or include only the second input/output pad 405 disposed on the second substrate 401. Alternatively, the semiconductor memory device 400 may include both the first input/output pad 305 and the second input/output pad 405.

In each of the external pad bonding region PA and the bit line bonding region BLBA included in the cell region CELL and the peripheral circuit region PERI, a metal pattern of the uppermost metal layer may exist as a dummy pattern, or the uppermost metal layer may be empty.

In the external pad bonding region PA of the semiconductor memory device 400, a lower metal pattern 373a having the same shape as an upper metal pattern 472a of the cell region CELL at the uppermost metal layer of the peripheral circuit region PERI and corresponding to the upper metal pattern 472a formed at the uppermost metal layer of the cell region CELL may be formed. The lower metal pattern 373a may be connected to lower bonding metal 372a and 371a which may be formed on circuit elements 320a. The lower metal pattern 373a formed at the uppermost metal layer of the peripheral circuit region PERI may not be connected to a separate contact in the peripheral circuit region PERI. Similarly, an upper metal pattern having the same shape as the lower metal pattern of the peripheral circuit region PERI at the upper metal layer of the cell region CELL and corresponding to the lower metal pattern formed at the uppermost metal layer of the peripheral circuit region PERI in the external pad bonding region PA may be formed.

The lower bonding metals 371b and 372b may be formed on the second metal layer 340b of the word line bonding region WLBA. In the word line bonding region WLBA, the lower bonding metals 371b and 372b of the peripheral circuit region PERI may be electrically connected to the upper bonding metals 471b and 472b of the cell region CELL by the bonding method.

In addition, in the bit line bonding region BLBA, an upper metal pattern 492 having the same shape as a lower metal pattern 352 (which is connected to lower bonding metal 351) of the peripheral circuit region PERI at the uppermost metal layer of the cell region CELL and corresponding to the lower metal pattern 352 formed at the uppermost metal layer of the peripheral circuit region PERI may be formed. In some example embodiments, a contact may not be formed on the upper metal pattern 492 formed at the uppermost metal layer of the cell region CELL.

In some example embodiments, a reinforced metal pattern having the same cross-sectional shape as a metal pattern formed at the uppermost metal layer of the other one of the cell region CELL and the peripheral circuit region PERI and corresponding to the metal pattern formed at the uppermost metal layer of one of the cell region CELL and the peripheral circuit region PERI may be formed. A contact may not be formed in the reinforced metal pattern.

Figure 17:
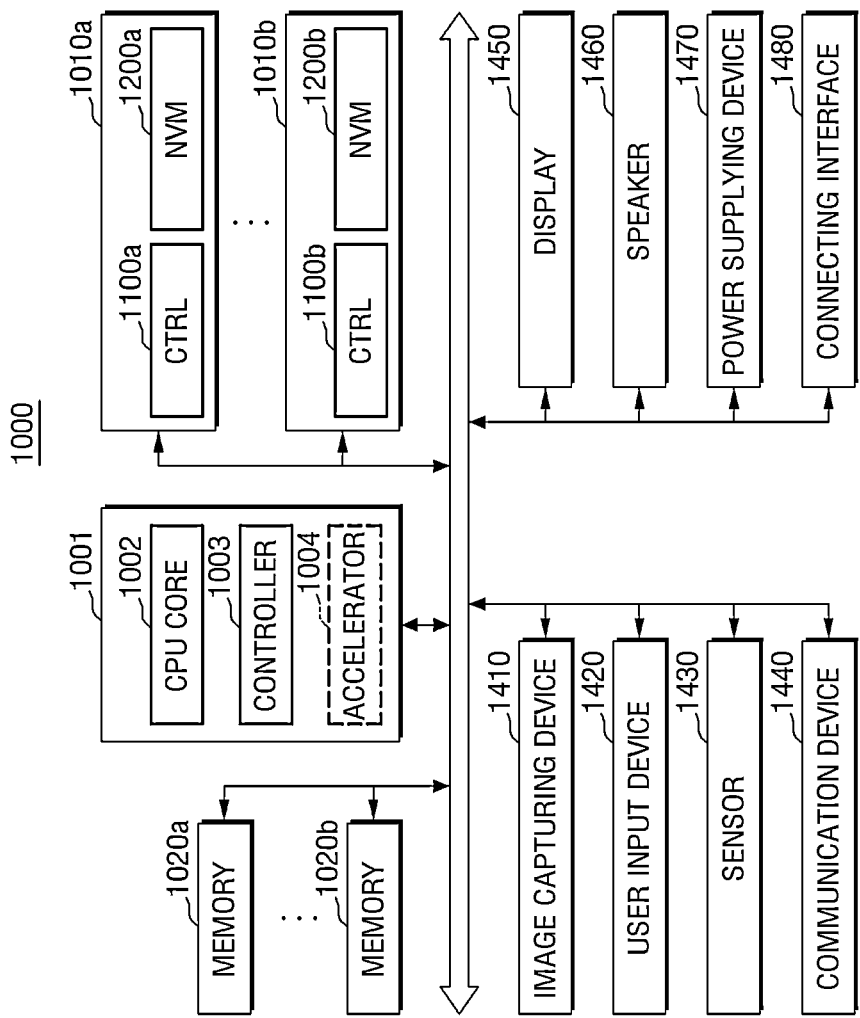
FIG. 17 is view illustrating a system 1000 to which the storage device according to some example embodiments of the present inventive concepts is applied.

FIG. 17 is view illustrating a system 1000 to which storage devices 1010a and 1010b according to some example embodiments of the present inventive concepts are applied.

Basically, the system 1000 of FIG. 17 may be a mobile system such as a mobile phone, a smart phone, a tablet personal computer, a wearable device, a healthcare device, or an internet of things (IOT) device. However, the system 1000 of FIG. 17 is not necessarily limited to the mobile system and may be a personal computer, a laptop computer, a server, a media player, or an automotive device such as a navigation system.

Referring to FIG. 17, the system 1000 may include a main processor 1001, memories 1020a and 1020b, and storage devices 1010a and 1010b and additionally include one or more of an image capturing device 1410, a user input device 1420, a sensor 1430, a communication device 1440, a display 1450, a speaker 1460, a power supplying device 1470, and a connecting interface 1480.

The main processor 1001 may control the overall operation of the system 1000, and more specifically, the operation of other components constituting the system 1000. The main processor 1001 may be implemented as a general-purpose processor, a dedicated processor, an application processor, or the like.

The main processor 1001 may include one or more CPU cores 1002 and may further include a controller 1003 for controlling the memories 1020a, 1020b and/or the storage devices 1010a and 1010b. According to some example embodiments, the main processor 1001 may further include an accelerator 1004 which is a dedicated circuit for high-speed data operation such as artificial intelligence (AI) data operation. The accelerator 1004 may include a graphics processing unit (GPU), a neural processing unit (NPU), and/or a data processing unit (DPU) and may be implemented as a separate chip which is physically independent from other components of the main processor 1001.

The memories 1020a and 1020b may be used as a main memory device of the system 1000, may include volatile memories such as SRAM and/or DRAM, but may include non-volatile memories such as flash memory, PRAM and/or RRAM. The memories 1020a and 1020b may be implemented in the same package as the main processor 1001.

The storage devices 1010a and 1010b may function as non-volatile storage devices that store data regardless of whether power is supplied or not and have a relatively larger storage capacity than the memories 1020a and 1020b. The storage devices 1010a and 1010b may include storage controllers 1100a and 1100b and non-volatile memories (NVM) 1200a and 1200b that store data under the control of the storage controllers 1100a and 1100b. The non-volatile memories 1200a and 1200b may include a flash memory having a two-dimensional (2D) structure or a three-dimensional (3D) vertical NAND (V-NAND) structure but may include other types of non-volatile memory such as a PRAM and/or RRAM.

The storage devices 1010a and 1010b may be included in the system 1000 in a state physically separated from the main processor 1001 or may be implemented in the same package as the main processor 1001. In addition, the storage devices 1010a and 1010b have the same shape as a solid-state device (SSD) or a memory card, and thus the storage devices may be detachably coupled to other components of the system 1000 through an interface such as a connecting interface 1480 to be described later. Such storage devices 1010a and 1010b may be devices to which standard protocols such as a universal flash storage (UFS), an embedded multi-media card (eMMC), or a non-volatile memory express (NVMe) are applied, but the present inventive concepts are not necessarily limited thereto. The storage devices 1010a and 1010b correspond to the storage device 10 of FIG. 1. In some example embodiments, the main processor 1001 and/or any portion thereof (e.g., controller 1003) may be configured (e.g., programmed) to control one or more of the storage devices 1010a and/or 1010b to perform some or all of the erase operations according to any of the example embodiments. Accordingly, the system 1000 may be understood to be configured to perform some or all portions of any operations that may be performed by a storage device, semiconductor memory device, or the like according to any of the example embodiments, including the erase operation (e.g., causing certain voltages to be applied to certain word line groups of one or more storage devices 1010a and/or 1010b) according to any of the example embodiments.

The image capturing device 1410 may capture a still image or a moving image and may be a camera, a camcorder, and/or a webcam.

The user input device 1420 may receive various types of data input from a user of the system 1000 and may be a touch pad, a keypad, a keyboard, a mouse, and/or a microphone.

The sensor 1430 may sense various types of physical quantities that may be obtained from the outside of the system 1000 and convert the sensed physical quantities into electrical signals. Such a sensor 1430 may be a temperature sensor, a pressure sensor, an illuminance sensor, a position sensor, an acceleration sensor, a biosensor and/or a gyroscope sensor.

The communication device 1440 may transmit and receive signals to and from other devices outside the system 1000 according to various communication protocols. Such a communication device 1440 may be implemented to include an antenna, a transceiver, and/or a modem.

The display 1450 and the speaker 1460 may function as output devices that respectively output visual information and audio information to the user of the system 1000.

The power supplying device 1470 may appropriately convert power supplied from a battery (not shown) built into the system 1000 and/or an external power source and may supply the converted power to each component of the system 1000.

The connecting interface 1480 may provide a connection between the system 1000 and an external device that is connected to the system 1000 to exchange data with the system 1000. The connecting interface 1480 may be implemented in various interface methods such as advanced technology attachment (ATA), serial ATA (SATA), external SATA (e-SATA), a small computer small interface (SCSI), a serial attached SCSI (SAS), a peripheral component interconnection (PCI), PCI express (PCIe), NVMe, IEEE 1394, a universal serial bus (USB), a secure digital (SD) card, a multi-media card (MMC), an eMMC, a UFS, an embedded universal flash storage (eUFS), a compact flash (CF) card interface, etc.

As described herein, any devices, systems, modules, units, controllers, circuits, and/or portions thereof according to any of the example embodiments (including, without limitation, storage device 10, controller 100, processor 120, semiconductor memory device 200, memory cell array 210, peripheral circuit 290, row decoder 293, page buffer 295, control logic 297, voltage generator 298, system 1000, main processor 1001, CPU core 1002, controller 1003, accelerator 1004, memory 1020a, memory 1020b, storage device 1010a, storage device 1010b, storage controller 1100a, storage controller 1100b, non-volatile memory 1200a, non-volatile memory 1200b, image capturing device 1410, user input device 1420, sensor 1430, communication device 1440, display 1450, speaker 1460, power supplying device 1470, connecting interface 1480, or the like) may include, may be included in, and/or may be implemented by one or more instances of processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a graphics processing unit (GPU), an application processor (AP), a digital signal processor (DSP), a microcomputer, a field programmable gate array (FPGA), and programmable logic unit, a microprocessor, application-specific integrated circuit (ASIC), a neural network processing unit (NPU), an Electronic Control Unit (ECU), an Image Signal Processor (ISP), and the like. In some example embodiments, the processing circuitry may include a non-transitory computer readable storage device (e.g., a memory), for example a solid state drive (SSD), storing a program of instructions, and a processor (e.g., CPU) configured to execute the program of instructions to implement the functionality and/or methods performed by some or all of any devices, systems, modules, units, controllers, circuits, and/or portions thereof according to any of the example embodiments, and/or any portions thereof.

Although some example embodiments of the present inventive concepts have been described above with reference to the accompanying drawings, it will be understood by those of ordinary skill in the art that the present inventive concepts are not limited thereto and may be implemented in many different forms without departing from the technical idea or essential features thereof. Therefore, it should be understood that the example embodiments set forth herein are merely examples in all respects and not restrictive.

What is claimed is:

1. A semiconductor memory device, comprising:
  a source layer in a substrate and including a conductive material doped with first conductivity type impurities;
  a channel structure on the substrate, the channel structure including a vertical insulation layer and a vertical channel layer, the channel structure extending in a first direction that is perpendicular to an upper surface of the substrate;
  a plurality of gate electrodes on the source layer and spaced apart from each other in the first direction on a sidewall of the channel structure, wherein the plurality of gate electrodes includes
    a first word line group including a first gate electrode and a second gate electrode that are continuously arranged in the first direction, and
    a second word line group including a third gate electrode and a fourth gate electrode that are continuously arranged in the first direction; and
  a common source line electrically connected to the source layer,
  wherein the semiconductor memory device is configured to, in response to a voltage of the common source line reaching a target voltage,
    cause an inhibition voltage to be applied to the second word line group and an erase voltage to be applied to the first word line group in a first interval during an erase operation, and
    cause the inhibition voltage to be applied to the first word line group and the erase voltage to be applied to the second word line group in a second interval after the first interval during the erase operation.

2. The semiconductor memory device of claim 1, wherein the inhibition voltage is greater than the erase voltage.

3. The semiconductor memory device of claim 1, wherein the plurality of gate electrodes includes a gate-induced drain leakage (GIDL) line.

4. The semiconductor memory device of claim 3, wherein
the source layer further includes a common source extension region extending along the vertical channel layer, and
the common source extension region overlaps at least a part of the gate-induced drain leakage (GIDL) line.

5. The semiconductor memory device of claim 1, wherein
the plurality of gate electrodes further include a third word line group including a fifth gate electrode and a sixth gate electrode that are continuously disposed, and
the semiconductor memory device is configured to cause the erase voltage to be applied to the third word line group in the first and second intervals during the erase operation.

6. The semiconductor memory device of claim 5, wherein the first to third word line groups are sequentially stacked from the substrate.

7. The semiconductor memory device of claim 6, wherein the vertical insulation layer has a thickness in a second direction in which the plurality of gate electrodes extend while extending in the first direction from the substrate.

8. The semiconductor memory device of claim 1, wherein the semiconductor memory device is configured to cause a channel potential of the vertical channel layer to be increased in response to a time point at which the inhibition voltage is applied to the second word line group.

9. The semiconductor memory device of claim 8, wherein the semiconductor memory device is configured to cause the channel potential to be lowered between a time point of applying the erase voltage to the second word line group and a time point of applying the inhibition voltage to the first word line group.

10. A semiconductor memory device, comprising:
a source layer in a substrate, the source layer including a conductive material doped with first conductivity type impurities;
a channel structure on the substrate, the channel structure including a vertical insulation layer and a vertical channel layer, the channel structure extending in a first direction that is perpendicular to an upper surface of the substrate;
a plurality of gate electrodes on the source layer and spaced apart from each other in the first direction on a sidewall of the channel structure, wherein the plurality of gate electrodes includes first to third word line groups sequentially disposed in the first direction from the substrate; and
a common source line electrically connected to the source layer,
wherein the semiconductor memory device is configured to, in response to a voltage of the common source line reaching a target voltage,
cause an inhibition voltage to be applied to the second word line group and an erase voltage to be applied to the first word line group in a first interval during an erase operation,
cause the inhibition voltage to be applied to the first word line group and the erase voltage to be applied to the second word line group in a second interval after the first interval during the erase operation, and
cause the erase voltage to be applied to the third word line group in the first and second intervals during the erase operation.

11. The semiconductor memory device of claim 10, wherein
the first word line group includes a first gate electrode and a second gate electrode continuously arranged in the first direction,
the second word line group includes a third gate electrode and a fourth gate electrode continuously arranged in the first direction, and
the third word line group includes a fifth gate electrode and a sixth gate electrode continuously arranged in the first direction.

12. The semiconductor memory device of claim 10, wherein the first to third word line groups are sequentially stacked from the substrate.

13. The semiconductor memory device of claim 10, wherein the plurality of gate electrodes includes a gate-induced drain leakage (GIDL) line.

14. The semiconductor memory device of claim 10, wherein the semiconductor memory device is configured to cause a channel potential of the vertical channel layer to be increased in response to a time point at which the inhibition voltage is applied to the second word line group.

15. The semiconductor memory device of claim 14, wherein the semiconductor memory device is configured to cause the inhibition voltage applied to the second word line group to be applied in a form of a plurality of pulse waves.

16. A storage system, comprising:
a non-volatile memory device; and
a controller electrically connected to the non-volatile memory device,
wherein the non-volatile memory device includes
a source layer in a substrate, the source layer including a conductive material doped with first conductivity type impurities,
a channel structure on the substrate, the channel structure including a vertical insulation layer and a vertical channel layer, the channel structure extending in a first direction that is perpendicular to an upper surface of the substrate,
a plurality of gate electrodes on the source layer and spaced apart from each other in the first direction on a sidewall of the channel structure, wherein the plurality of gate electrodes includes
a first word line group including a first gate electrode and a second gate electrode that are continuously arranged in the first direction, and
a second word line group including a third gate electrode and a fourth gate electrode that are continuously arranged in the first direction,
a plurality of pass transistors connected to the plurality of gate electrodes, and
a common source line electrically connected to the source layer,
wherein the storage system is configured to, in response to a voltage of the common source line reaching a target voltage,
cause an inhibition voltage to be applied to the second word line group and an erase voltage to be applied to the first word line group in a first interval during an erase operation, and
cause the inhibition voltage to be applied to the first word line group and the erase voltage to be applied to the second word line group in a second interval after the first interval during the erase operation.

17. The storage system of claim 16, wherein
the plurality of gate electrodes further includes a third word line group including a fifth gate electrode and a sixth gate electrode that are continuously arranged, and
the storage system is configured to cause the erase voltage to be applied to the third word line group in the first and second intervals during the erase operation.

18. The storage system of claim 17, wherein the first to third word line groups are sequentially stacked from the substrate.

19. The storage system of claim 16, wherein the storage system is configured to cause a voltage to be applied to the plurality of gate electrodes based on providing a same block signal to gates of the plurality of pass transistors.

20. The storage system of claim 16, wherein
the plurality of pass transistors includes a first pass transistor connected to the first gate electrode and a second pass transistor connected to the third gate electrode, and
the storage system is configured to cause a pass signal to be provided to each of a gate of the first pass transistor and a gate of the second pass transistor.

\* \* \* \* \*